United States Patent
Arimura et al.

(10) Patent No.: US 7,531,288 B2
(45) Date of Patent: May 12, 2009

(54) PHOTOSENSITIVE LITHOGRAPHIC PRINTING PLATE

(75) Inventors: Keisuke Arimura, Shizuoka (JP); Takahiro Goto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/234,152

(22) Filed: Sep. 26, 2005

(65) Prior Publication Data

US 2006/0068328 A1    Mar. 30, 2006

(30) Foreign Application Priority Data

Sep. 24, 2004    (JP)    ............ P. 2004-277399

(51) Int. Cl.
*G03F 7/00* (2006.01)
*G03F 7/004* (2006.01)

(52) U.S. Cl. ........... 430/270.1; 430/273.1; 430/302; 430/944; 430/905; 430/917

(58) Field of Classification Search ........... 430/270.1, 430/273.1, 302, 944, 905, 917
See application file for complete search history.

(56) References Cited

U.S. PATENT DOCUMENTS

| | | | |
|---|---|---|---|
| 5,256,520 A | 10/1993 | Smothers | |
| 6,277,541 B1* | 8/2001 | Uno et al. | 430/278.1 |
| 6,664,025 B2* | 12/2003 | Baumann et al. | 430/281.1 |
| 2003/0129523 A1 | 7/2003 | Matsumoto et al. | |
| 2004/0062939 A1* | 4/2004 | Shimada et al. | 428/474.4 |
| 2005/0069811 A1* | 3/2005 | Mitsumoto et al. | 430/270.1 |

FOREIGN PATENT DOCUMENTS

| | | |
|---|---|---|
| EP | 1 035 435 A2 | 9/2000 |
| EP | 1 048 982 B1 | 10/2002 |

* cited by examiner

*Primary Examiner*—Amanda C. Walke
(74) *Attorney, Agent, or Firm*—Sughrue Mion, PLLC

(57) ABSTRACT

A photosensitive lithographic printing plate comprising: a hydrophilic support; and a photosensitive layer containing a polymerization initiator, a chain transfer agent, a compound having an ethylenically unsaturated double bond and a polymer binder having a crosslinkable group in a side chain, wherein the chain transfer agent is a thiol compound represented by the following formula (I):

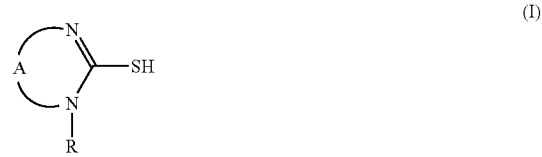

in which R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

10 Claims, No Drawings

PHOTOSENSITIVE LITHOGRAPHIC PRINTING PLATE

FIELD OF THE INVENTION

The present invention relates to a photosensitive lithographic printing plate. More particularly, it relates to a negative-working photosensitive lithographic printing plate which is excellent in preservation stability and exhibits high sensitivity and good printing durability.

BACKGROUND OF THE INVENTION

In negative-working photosensitive lithographic printing plates, in general, image formation is carried out by a process of coating a photosensitive composition on a support, for example, an aluminum plate subjected to surface roughening treatment, exposing a desired image, polymerizing or crosslinking the exposed area in the photosensitive layer to insolubilize it in a developing solution and dissolving out the unexposed area with the developing solution. As photosensitive compositions used for such a purpose, photopolymerizable compositions have hitherto been well known, a part of which is already put into practical use. Also, in recent high-speed photopolymers which adopt a photoinitiation system technology that is highly sensitive to visible light, the sensitivity increases to a region employable for direct plate making by a visible laser, and a so-called CTP plate becomes widespread.

In order to respond to increase in drawing speed for pursuit of higher productivity, further increase in the sensitivity is necessary. Not only that, requirement for handling ability not in a dark room but under a yellow lamp or a white lamp increases (treatment in a bright room) in view of workability. For the purpose of increase in the sensitivity, design and development of photopolymerization initiators or photopolymerization initiation systems have been made, and hexaarylbiimidazole photopolymerization initiators draw attention as highly sensitive photopolymerization initiators. Many of the hexaarylbiimidazole photopolymerization initiators do not have absorption in the visible region and a photosensitive composition containing the hexaarylbiimidazole photopolymerization initiator makes it possible to conduct the treatment in a bright room in combination with an exposure system of a ultraviolet to violet laser having a wavelength of 300 to 450 nm or an infrared laser having a wavelength of 800 to 1,200.

However, the hexaarylbiimidazole photopolymerization initiator alone has insufficient sensitivity and thus, it is necessary to use a cosensitizer. As the cosensitizer, a thiol compound is ordinarily used (see, for example, U.S. Pat. No. 5,256,520). However, unfortunately, the thiol compound not only has peculiar odor but also is volatile. When the thiol compound is used in a photosensitive layer of a photosensitive lithographic printing plate, it vaporizes from the photosensitive layer or diffuses into other layers during preservation to cause a problem of decrease in the sensitivity.

SUMMARY OF THE INVENTION

The present invention aims at overcoming the above described problem. Specifically, an object of the present invention is to provide a photosensitive lithographic printing plate which is excellent in preservation stability and exhibits high sensitivity and good printing durability.

As a result of intensive investigations, the inventor has found that the above-described object can be achieved by using a specific thiol compound. Specifically, the present invention includes the following items.

1. A photosensitive lithographic printing plate comprising a hydrophilic support having thereon a photosensitive layer containing a polymerization initiator, a chain transfer agent, a compound having an ethylenically unsaturated double bond and a polymer binder having a crosslinkable group in a side chain, wherein the chain transfer agent is a thiol compound represented by the following formula (I):

In formula (I), R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

2. The photosensitive lithographic printing plate as described in 1 above, wherein the thiol compound represented by formula (I) is at least one member selected from the group consisting of compounds represented by the following formulae (II) and (III):

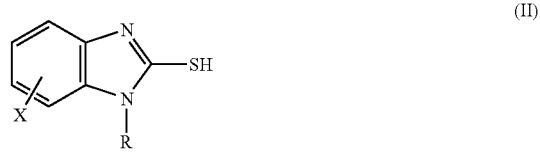

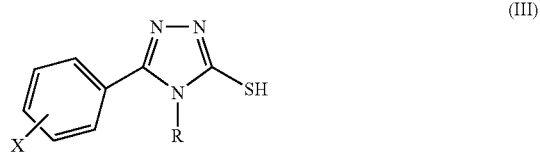

In formulae (II) and (III), R represents an alkyl group which may have a substituent or an aryl group which may have a substituent; and X represents a halogen atom, an alkoxy group, an alkyl group which may have a substituent or an aryl group which may have a substituent.

3. The photosensitive lithographic printing plate as described in item 1 or 2 above, wherein the polymer binder is at least one member selected from the group consisting of a (meth) acrylic copolymer having a crosslinkable group in a side chain and a polyurethane resin having a crosslinkable group in a side chain.

4. The photosensitive lithographic printing plate as described in any one of items 1 to 3 above, wherein the polymerization initiator is at least one member selected from the group consisting of a hexaarylbiimidazole compound, an onium salt, a trihalomethyl compound and a metallocene compound.

5. The photosensitive lithographic printing plate as described in any one of items 1 to 4 above, which further comprises a protective layer on the photosensitive layer.

According to the present invention, a photosensitive lithographic printing plate which is excellent in preservation stability and exhibits high sensitivity and good printing durability is provided.

DETAILED DESCRIPTION OF THE INVENTION

[Thiol Compound]

In the photosensitive layer according to the invention, a thiol compound represented by formula (I) shown below is used. By using the thiol compound as a chain transfer agent, the problem of the odor and the decrease in sensitivity due to the evaporation from the photosensitive layer or diffusion into other layers are avoided and a photosensitive lithographic printing plate which is excellent in preservation stability and exhibits high sensitivity and good printing durability is obtained.

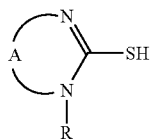
(I)

In formula (I), R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

Compounds represented by formulae (II) and (III) shown below are more preferably used.

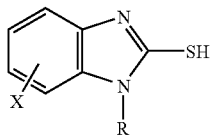
(II)

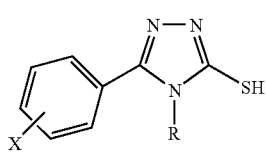
(III)

In formulae (II) and (III), R represents an alkyl group which may have a substituent or an aryl group which may have a substituent; and X represents a halogen atom, an alkoxy group, an alkyl group which may have a substituent or an aryl group which may have a substituent.

Specific examples of the compound represented by formula (I) are set forth below, but the invention should not be construed as being limited thereto.

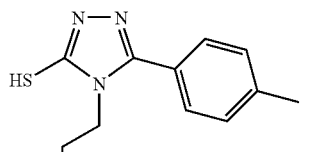

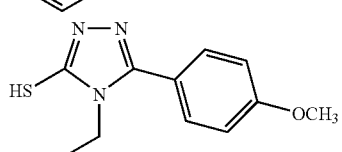

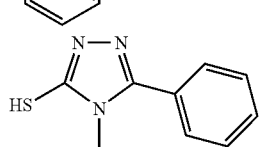

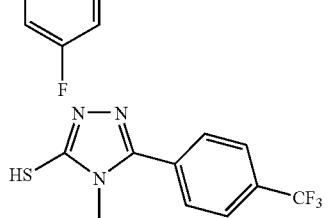

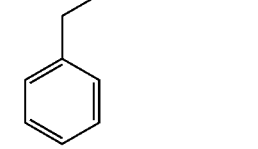

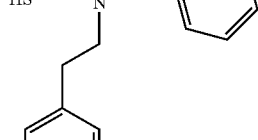

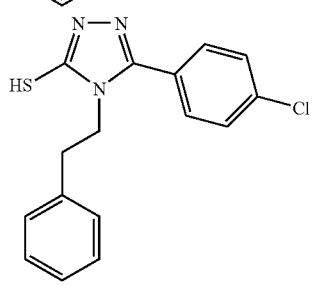

-continued
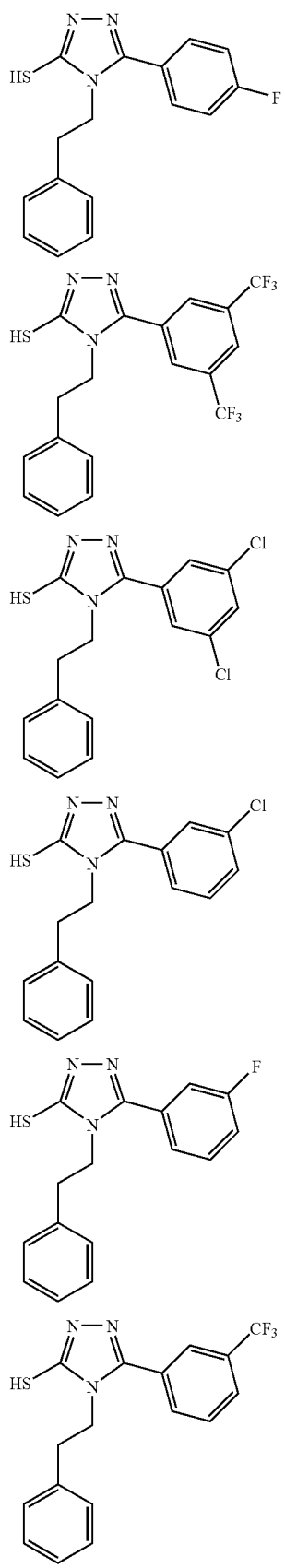
-continued
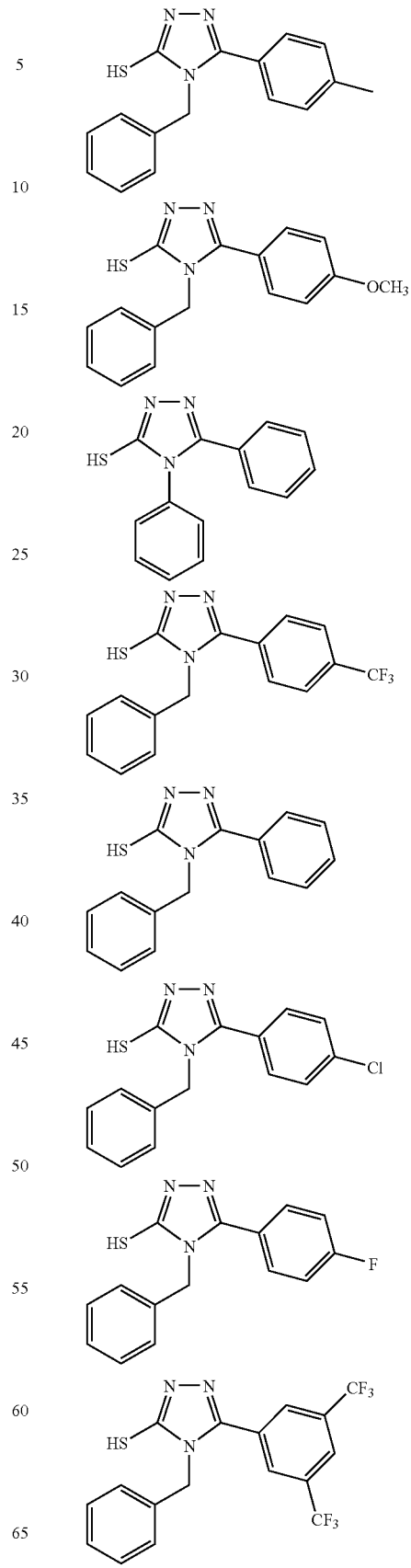

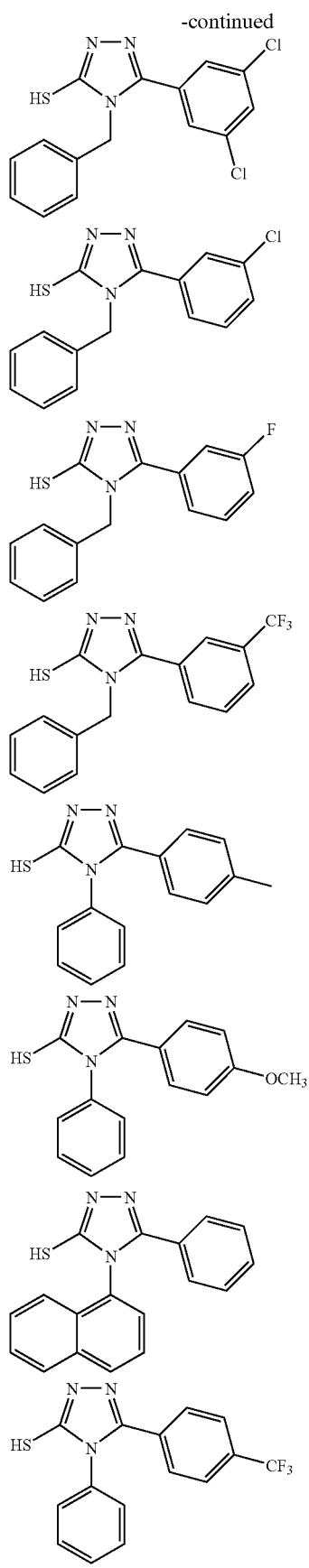
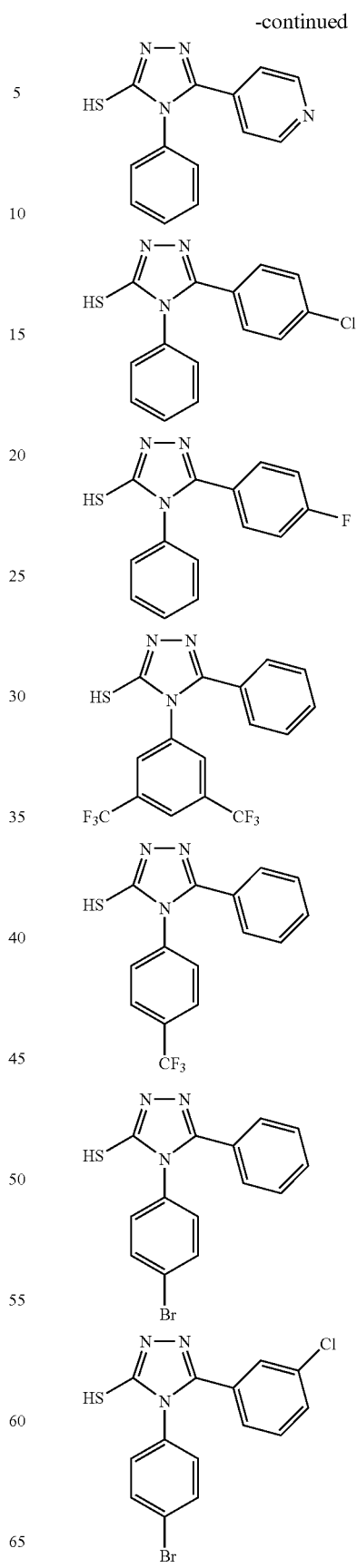

-continued
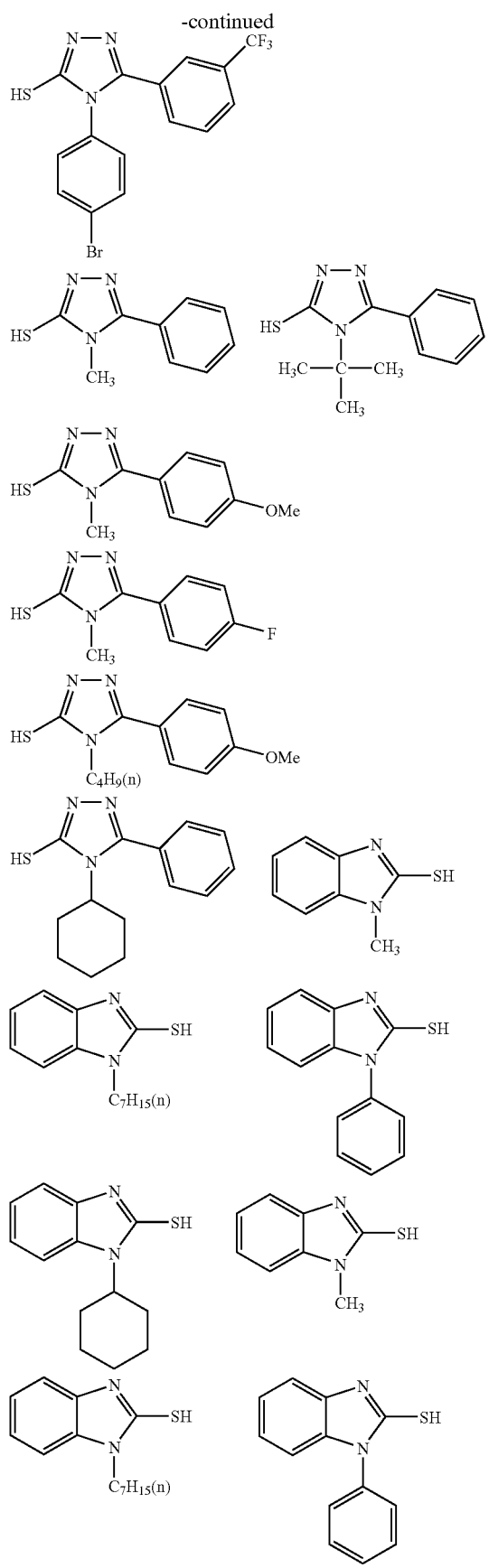
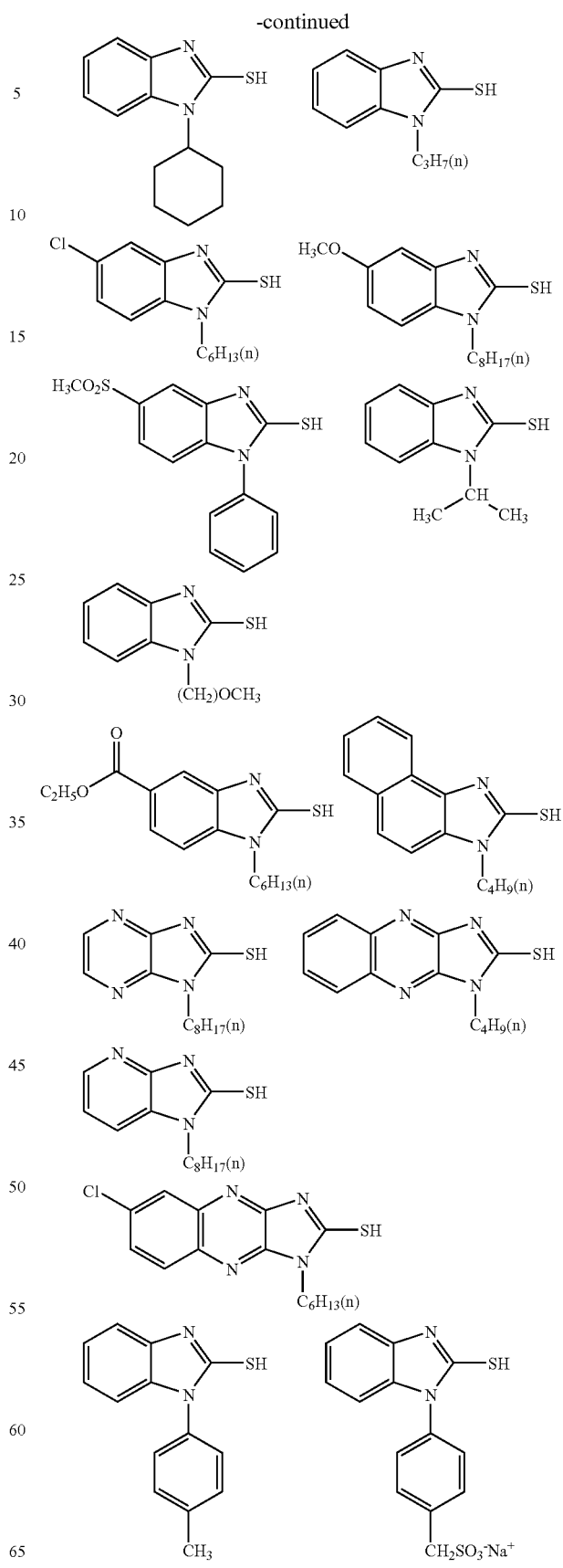

An amount of the thiol compound used is preferably from 0.01 to 20% by weight, more preferably from 0.1 to 15% by weight, ard still more preferably from 1.0 to 10% by weight, based on the total solid content of the photosensitive layer.

[Compound Having Ethylenically Unsaturated Double Bond]

The compound having an ethylenically unsaturated double bond (hereinafter, also referred to as an "ethylenically unsaturated compound") is a compound having an ethylenically unsaturated bond, which is addition-polymerized by the action of a polymerization initiator to crosslink or harden, when the photosensitive layer is irradiated with active radiation. The compound having an addition-polymerizable ethylenically unsaturated bond can be appropriately selected from compounds having at least one, preferably two or more terminal ethylenically unsaturated bonds. The compound has a chemical form, for example, a monomer, a prepolymer (i.e., dimmer, trimer or oligomer), or a mixture thereof.

Examples of the monomer include esters between an unsaturated carboxylic acid (for example, acrylic acid, methacrylic acid, itaconic acid, crotonic acid, isocrotonic acid or maleic acid) and an aliphatic polyhydric alcohol compound and amides between an unsaturated carboxylic acid and an aliphatic polyamine compound.

Specific examples of the monomer of the ester between an aliphatic polyhydric alcohol compound and an unsaturated carboxylic acid include acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer;

methacrylates, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane or bis-[p-(methacryloxyethoxy)phenyl]dimethylmethane;

itaconates, for example, ethylene glydcol diitaconate, propylene glycol diitaconate, 1,5-butanediol diitaconate, 1,4-butanediol diitaconate, tetramethylene glycol diitaconate, pentaerythritol diitaconate or sorbitol tetraitaconate; crotonatates, for example, ethylene glycol dicrotonate, tetramethylene glycol dicrotonate, pentaerythritol dicrotonate or sorbitol tetradicrotonate; isocrotonates, for example, ethylene glycol diisocrotonate, pentaerythritol diisocrotonate or sorbitol tetraisocrotonate;

and maleates, for example, ethylene glycol dimaleate, triethylene glycol dimaleate, pentaerythritol dimaleate or sorbitol tetramaleate. Further, mixtures of the ester monomers are exemplified. Also, specific examples of the monomer of the amide between an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

In addition, vinylurethane compounds having two or more polymerizable vinyl groups per molecule described in JP-B-48-41708, which are obtained by adding a hydroxy group-containing vinyl monomer represented by formula (A) shown below to a polyisocyanate compound having two or more isocyanato groups per molecule.

$$CH_2=C(R)COOCH_2CH(R')OH \quad (A)$$

wherein R and R' each independently represents H or $CH_3$.

Also, urethane acrylates described in JP-A51-37193 and JP-B-2-32293, polyester acrylates described in JP-A-48-64183, JP-49-43191 and JP-B-52-30490, and polyfunctional acrylates or methacrylates, for example, epoxyacrylates obtained by reacting an epoxy resin with (meth)acrylic acid are set forth. Further, photo-curable monomers and oligomers described in *Nippon Secchaku Kyokaishi*, Vol. 20, No. 7, pages 300 to 308 (1984) may be used.

The compound having an ethylenically unsaturated bond is ordinarily used in an amount of from 5 to 80% by weight, preferably fom 30 to 70% by weight, based on the total weight of the pbotosensitive layer.

[Polymer Binder Having Crosslinkable Group in Side Chain]

In the photosensitive layer according to the invention, a polymer binder having a crosslinkable group in a side chain is used. The crosslinkable group means a group capable of crosslinking the polymer binder in the process of a radical polymerization reaction which is caused in the photosensitive layer, when the photosensitive lithographic printing plate is exposed to light. The crosslinkable group is not particularly restricted as long as it has such a function and includes, for example, an ethylenically unsaturated bonding group, an amino group or an epoxy group as a functional group capable of conducting an addition polymerization reaction Also, a functional group capable of forming a radical upon irradiation with light may be used and such a crosslinkable group includes, for example, a thiol group, a halogen atom and an onium salt structure.

Among them, the ethylenically unsaturated bonding group is preferable, and functional groups represented by formulae (1) to (3) shown below are particularly preferable.

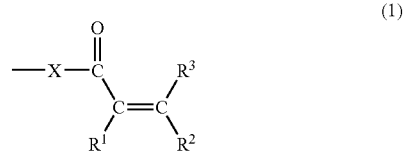

(1)

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxy group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxy group, an alkoxycarbonyl group, an alkyl group which may have a substituent or an aryl group which may have a substituent is preferable because of high radical reactivity.

X represents an oxygen atom, a sulfur atom or —N($R^{12}$)—, and $R^{12}$ represents a hydrogen atom or a monovalent organic group. The organic group represented by $R^{12}$ includes, for example, an alkyl group which may have a substituent. Among them, a hydrogen atom, a methyl group, an ethyl group or an isopropyl group is preferable because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxy group, an alkoxycarbonyl group, a sulfo group, a nitro group, a cyano group, an amido group, an alkylsulfonyl group and an arylsulfonyl group.

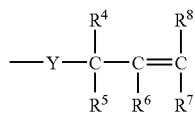

(2)

In formula (2), $R^4$ to $R^8$ each independently represents a hydrogen atom or a monovalent organic group. $R^4$ to $R^8$ each independently preferably includes, for example, a hydrogen atom, a halogen atone an amino group, a dialkylamino groups a carboxy group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxy group, an alkoxycarbonyl group, an alkyl group which may have a substituent or an aryl group which may have a substituent is preferable.

Examples of the substituent introduced include those described in Formula (1). Y represents an oxygen atom, a sulfur atom or —N($R^{12}$)—, and $R^{12}$ has the same meaning as $R^{12}$ defined in Formula (1). Preferred examples for $R^{12}$ are also same as those described in Formula (1).

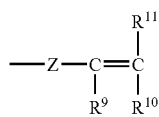

(3)

In formula (3), $R^9$ represents a hydrogen atom or a monovalent organic group, and preferably represents a hydrogen atom or an alkyl group which may have a substituent. Among them, a hydrogen atom or a methyl group is preferable because of high radical reactivity. $R^{10}$ and $R^{11}$ each independently represents, for example, a hydrogen atom a halogen atom, an amino group, a dialkylamino group, a carboxy group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxy group, an alkoxycarbonyl group, an alkyl group which may have a substituent or an aryl group which may have a substituent is preferable because of high radical reactivity.

Examples of the substituent introduced include those described in Formula (1). Z represents an oxygen atom, a sulfur atom, —N($R^{13}$)— or a phenylene group which may have a substituent. $R^{13}$ preferably includes an alkyl group which may have a substituent. Among them, a methyl group, an ethyl group or an isopropyl group is preferable because of high radical reactivity.

The polymer binder having a crosslinkable group in a side chain according to the invention not only functions as a film-forming agent but also is preferably an organic polymer which is soluble or swellable in alkali water since it is needed to be dissolved in a developer, preferably an alkali developer. Therefore, it is preferred that the polymer binder according to the invention has an alkali-soluble group, for example, a carboxy group, in the side chain in addition to the crosslinkable group. In the case where the polymer binder having a crosslinkable group in a side chain is a water-soluble organic polymer, it is possible to conduct water development.

Examples of the polymer binder according to the invention include (meth)acrylic acid copolymers, itaconic acid copolymers, crotonic acid copolymers, maleic acid copolymers and partially esterified maleic acid copolymers each having a crosslinkable group, for example, an allyl group or a (meth) acryloyl group in the side chain thereof as described in JP-A-59-53836 and JP-A-59-71048.

Also, polyurethanes, acid cellulose derivatives and adducts between an addition polymer having a hydroxy group and a cyclic acid anhydride, each having the crosslinkable group and carboxy group in the side chain are useful as the polymer binder according to the invention.

Of the polymers, the (meth)acrylic acid copolymers and polyurethanes are more preferable. In particular, the polyurethane resins are preferable from the standpoint that development damage in the exposed area can be prevented without accompanying with decrease in developing property in the unexposed area so that both good stain resistance and high printing durability can be achieved, even when an acid value of the photosensitive layer is low.

The polyurethane resin having a crosslinkable group in the side chain thereof is described in more detail below.

The polyurethane resin having a crosslinkable group in the side chain thereof particularly preferably used in the invention can be obtained by a polyaddition reaction of (i) a diisocyanate compound, (ii) a diol compound having a carboxy group, (iii) a diisocyanate compound having a crosslinkable group, and if desired, (iv) a diol compound containing no carboxy group.

The diisocyanate compound and diol compound which are starting materials of the polyurethane resin will be described in more detail below.

(i) Diisocyanate Compound

Examples of the diisocyanate compound include diisocyanate compounds represented by the following formula (4):

OCN-L-NCO (4)

In formula (4), L represents a single bond or a divalent aliphatic or aromatic hydrocarbon group which may have a substituent. If desired, L may contain other functional group which does not react with the isocyanate group, for example, a carbonyl group, an ester group, a urethane group, an amido group or a ureido group. More specifically, L represents a single bond or a divalent aliphatic or aromatic hydrocarbon group which may have a substituent (preferably, for example, an alkyl group, an aralkyl group, an aryl group, an alkoxy group or a halogeno group); preferably an alkylene group having from 1 to 20 carbon atoms or an arylene group having from 6 to 15 carbon atoms; and more preferably an alkylene group having from 1 to 8 carbon atoms. Also, if desired, L may contain other functional group which does not react with the isocyanate group, for example, a carbonyl group, an ester group, a urethane group, an amido group, a ureido group or an ether group.

Specific examples of the diisocyanate compound represented by formula (4) include the following compounds. Specifically, an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthalene diisocyanate or 3,3'-dimethylbiphenyl-4,4'-diisocyanate; an aliphatic diisocyanate compound, for example, hexamethylene diisocyanate, trimethylhexamethylene diisocyanate, lysine diisocyanate or dimeric acid diisocyanate; an alicyclic diisocyanate compound, for example isophorone diisocyanate, 4,4'-methylenebis(cyclohexyl isocyanate), methylcyclohexane-2,4(or 2,6)-diisocyanate or 1,3-(isocyanatomethyl)cyclohexane; and a diisocyanate compound obtained by a reaction of diol with diisocyanate, for example, an adduct of 1 mole of 1,3-butylene glycol with 2 moles of tolylene diisocyanate are exemplified.

The diisocyanate compounds may be used individually or in combination of two or more thereof. In view of the balance between printing durability and stain resistance, it is preferred to use two or more of the diisocyanate compounds in combination, and it is particularly preferred to use at least one of the aromatic diisocyanate compounds (L represents an aromatic group) and at least one of the aliphatic diisocyanate compounds (L represents an aliphatic group).

With respect to an amount of the diisocyanate compound used, a molar ration of the diisocyanate compound to the diol compound is preferably from 0.8 to 1.2, and more preferably from 0.9 to 1.1. In the case where an isocyanate group remains at a polymer terminal because of using an excess amount of the diisocyanate compound to the diol compound, it is preferred to treat the compound after the urethanization reaction with an alcohol or an amine to finally synthesize a compound having no residual isocyanate group at the terminal.

(ii) Diol Compound Having At Least One Carboxy Group

The diol compound having at least one carboxy group includes diol compounds represented by formulae (5), (6) and (7) shown below and/or a compound obtained by ring opening of a tetracarboxylic acid dianhydride with a diol compound. The diol compound used for the purpose of ring opening of the tetracarboxylic acid dianhydride can be used.

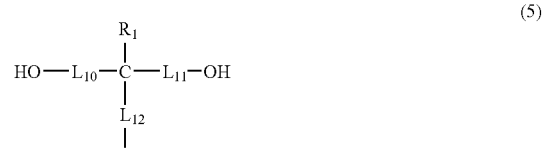

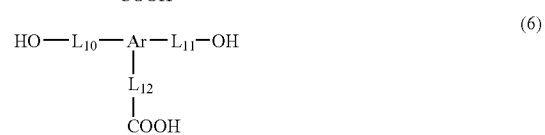

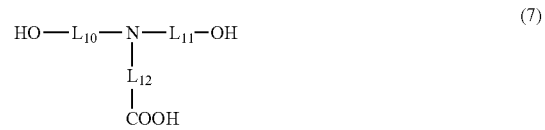

In the formulae, $R_1$ represents a hydrogen atom, an alkyl group, an aralkyl group, an aryl group, an alkoxy group or an aryloxy group, each of which may have a substituent (for example, a cyano group, a nitro group, a halogen atom (e.g., —F, —Cl, —Br or —I), —CONH$_2$, —COOR$_{113}$, —OR$_{113}$, —NHCONHR$_{113}$, —NHCOOR$_{113}$, —NHCOR$_{113}$ or —OCONHR$_{113}$ (wherein R$_{113}$ represents an alkyl group having from 1 to 10 carbon atoms or an aralkyl group having from 7 to 15 carbon atoms)); and preferably a hydrogen atom, an alkyl group having from 1 to 8 carbon atoms or an aryl group having from 6 to 15 carbon atoms. $L_{10}$, $L_{11}$ and $L_{12}$, which may be the same or different, each represents a single bond or a divalent aliphatic or aromatic hydrocarbon group which may have a substituent preferably, for example, an alkyl group, an aralkyl group, an amyl group, an alkoxy group or a halogeno group); preferably an alkylene group having from 1 to 20 carbon atoms or an arylene group having from 6 to 15 carbon atoms; and more preferably an alkylene group Having from 1 to 8 carbon atoms. Also, if desired, $L_{10}$, $L_{11}$, and $L_{12}$ each may contain other functional group which does not react with the isocyanate group, for example, a carbonyl group, an ester group, a urethane group, an amido group, a ureido group or an ether group. Further, two or three of $R_{11}$, $L_{10}$, $L_{11}$ and $L_{12}$ may be taken together to form a ring. Ar represents a trivalent aromatic hydrocarbon group which may have substituent, and preferably an aromatic group having from 6 to 15 carbon atoms.

Specific examples of the diol compound having a carboxy group represented by formula (5), (6) or (7) include the following compounds.

Specifically, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl) acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxypropionamide are exemplified.

Preferable examples of the tetracarboxylic acid dihydrate, which is used in the preparation of the diol compound having at least one carboxy group, include compounds represented by formulae (8), (9) and (10) shown below.

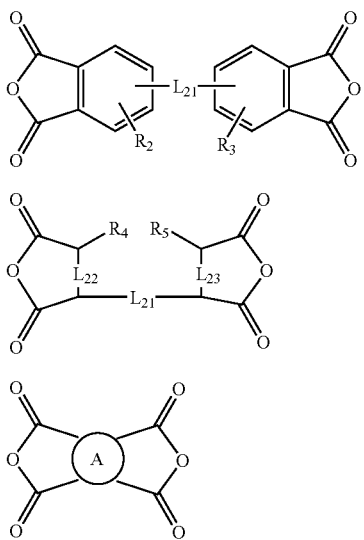

In the formulae, $L_{21}$ represents a single bond, a divalent aliphatic or aromatic hydrocarbon group which may have a substituent (preferably, for example, an alkyl group, an aralkyl group, an aryl group, an alkoxy group, a halogeno group, an ester group or an amido group), —CO—, —SO—, —SO$_2$—, —O— or -s-; and preferably a single bond, a divalent aliphatic hydrocarbon group having from 1 to 15 carbon atoms, —CO—, —SO$_2$—, —O— or -s-. $R_2$ and $R_3$, which may be the same or different, each represents a hydrogen atom an alkyl group, an aralkyl group, an aryl group, an alkoxy group or a halogeno group, and preferably a hydrogen atom, an alkyl group having from 1 to 8 carbon atoms, an aryl group having from 6 to 15 carbon atoms, an alkoxy group having from 1 to 8 carbon atoms or a halogeno group. Alternatively, two of $L_{21}$, $R_2$ and $R_3$ may be combined with each other to form a ring. $R_4$ and $R_5$, which may be the same or different, each represents a hydrogen atom, an alkyl group, an aralkyl group, an aryl group or a halogeno group; and preferably a hydrogen atom, an alkyl group having from 1 to 8 carbon atoms or an aryl group having from 6 to 15 carbon atoms. Alternatively, two of $L_{21}$, $R_4$ and $R_5$ may be combined with each other to form a ring. $L_{22}$ and $L_{23}$, which may be the same or different, each represents a single bond, a double bond or a divalent aliphatic hydrocarbon group; and preferably a single bond, a double bond or a methylene group. A represents a monocyclic or polycyclic aromatic ring, and preferably an aromatic ring having from 6 to 18 carbon atoms.

Specific examples of the compound represented by formula (8), (9) or (10) include the following compounds.

Specifically, an aromatic tetracarboxylic acid dihydride, for example, pyromellitic acid dihydride, 3,3',4,4'-benzophenonetetracarboxylic acid dihydride, 3,3',4,4'-diphenyltetracarboxylic acid dihydride, 2,3,6,7-naphthalenetetracarboxylic acid dihydride, 1,4,5,8-naphthalenetetracarboxylic acid dihydride, 4,4'-sulfonyldiphthalic acid dihydride, 2,2-bis(3,4-dicarboxyphenyl)propane dihydride, bis(3,4-dicarboxyphenyl)ether dihydride, 4,4'-[3,3'(alkylphosphoryldiphenylene)-bis(iminocarbonyl)]diphthalic acid dihydride, adduct of hydroquinonediacetate and trimellitic acid anhydride or adduct of diacetyldiamine and trimellitic acid anhydride; an alicyclic tetracarboxylic acid dihydride, for example, 5-(2,5-dioxotetrahydrofuryl)-3-methyl-3-cyclohexene-1,2-dicarboxylic acid dihydride (Epicron B-4400, produced by Dainippon Ink and Chemicals, Inc.), 1,2,3,4-cyclopentanetetracarboxylic acid dihydride, 1,2,4,5-cyclohexanetetracarboxylic acid dihydride or tetrahydrofurantetracarboxylic acid dihydride; and an aliphatic tetracarboxylic acid dihydride, for example, 1,2,3,4-butanetetracarboxylic acid dihydride or 1,2,4,5-pentanetetracarboxylic acid dihydride are exemplified.

By ring-opening of the tetracarboxylic acid dianhydride with a diol compound, (ii) the diol compound having at least one carboxy group can be synthesized. It is also possible that a reaction between the diol compound and (i) the diisocyanate compound is initially conducted and the resulting reaction product is reacted with the tetracarboxylic acid dianhydride to synthesize the polyurethane resin according to the invention. This method is also included in the concept of the invention. Specifically, the method of introducing a structural unit resulting from the tetracarboxylic acid dianhydride and the diol compound into the polyurethane resin includes the following methods:

a) Method wherein an alcohol-terminated compound obtained by ring-opening of the tetracarboxylic acid dianhydride with a diol compound is reacted with the diisocyanate compound; and b) Method wherein an alcohol-terminated urethane compound obtained by reacting the diisocyanate compound under excess of the diol compound is reacted with the tetracarboxylic acid dianhydride.

Of the diol compounds having at least one carboxylic group, the compounds represented by formula (5) are more preferable because of high solvent solubility and ease of synthesis. The diol compound having at least one carboxylic group is introduced into the polyurethane resin binder in an amount so that the polyurethane resin binder contains ordinarily from 0.2 to 4.0 meq/g, preferably from 0.3 to 3.0 meq/g, more preferably from 0.4 to 2.0 meq/g, particularly preferably from 0.5 to 1.5 meq/g, and most preferably from 0.6 to 1.2 meq/g, of the carboxy group. Therefore, although the content of the structure derived from the diol compounds having at least one carboxylic group in the polyurethane resin binder can be appropriately determined after considering a number of the carboxy group in the diol compound, other diol compound used in combination, an acid value or molecular weight of the resulting polyurethane resin binder, a composition or pH of developer and the like, it is, for example, ordinarily from 5 to 45% by mole, preferably from 10 to 40% by mole, and more preferably from 15 to 35% by mole.

(iii) Diisocyanate Compound Having Crosslinkable Group

The diisocyanate compound having a crosslinkable group includes, for example, a reaction product obtained by an addition reaction of a triisocyanate compound with one equivalent of a monofunctional alcohol or monofunctional amine compound having a crosslinkable group.

Examples of the triisocyanate compound are set forth below, but the invention should not be construed as being limited thereto.

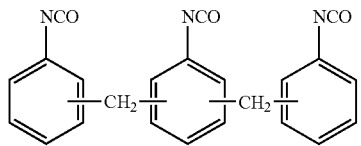

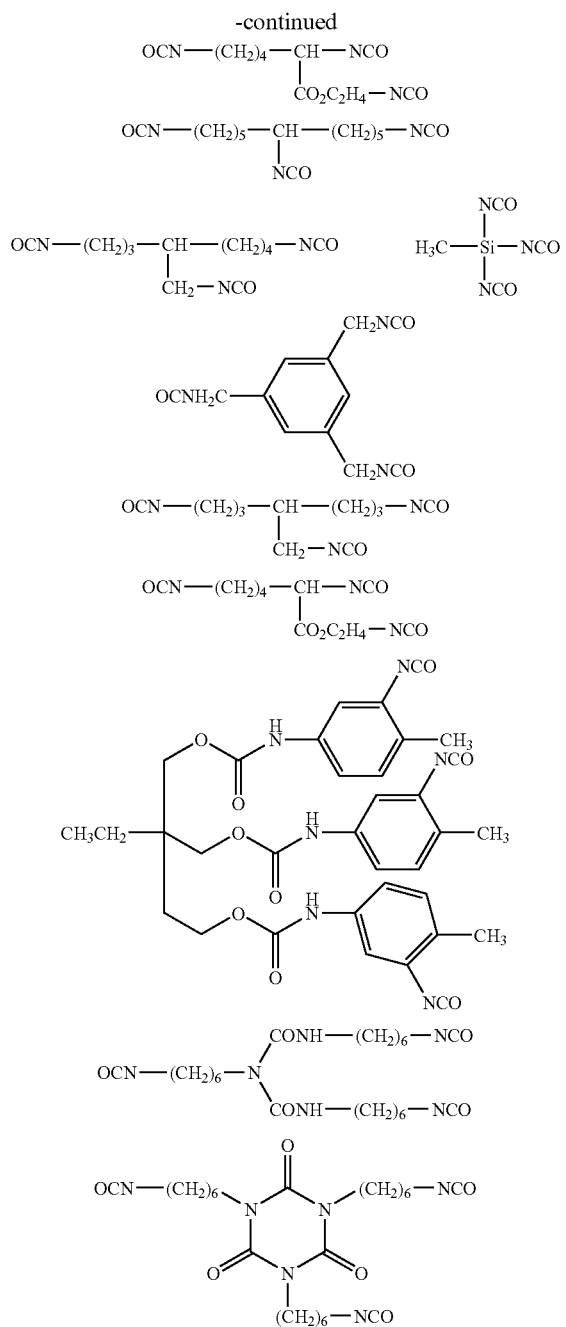
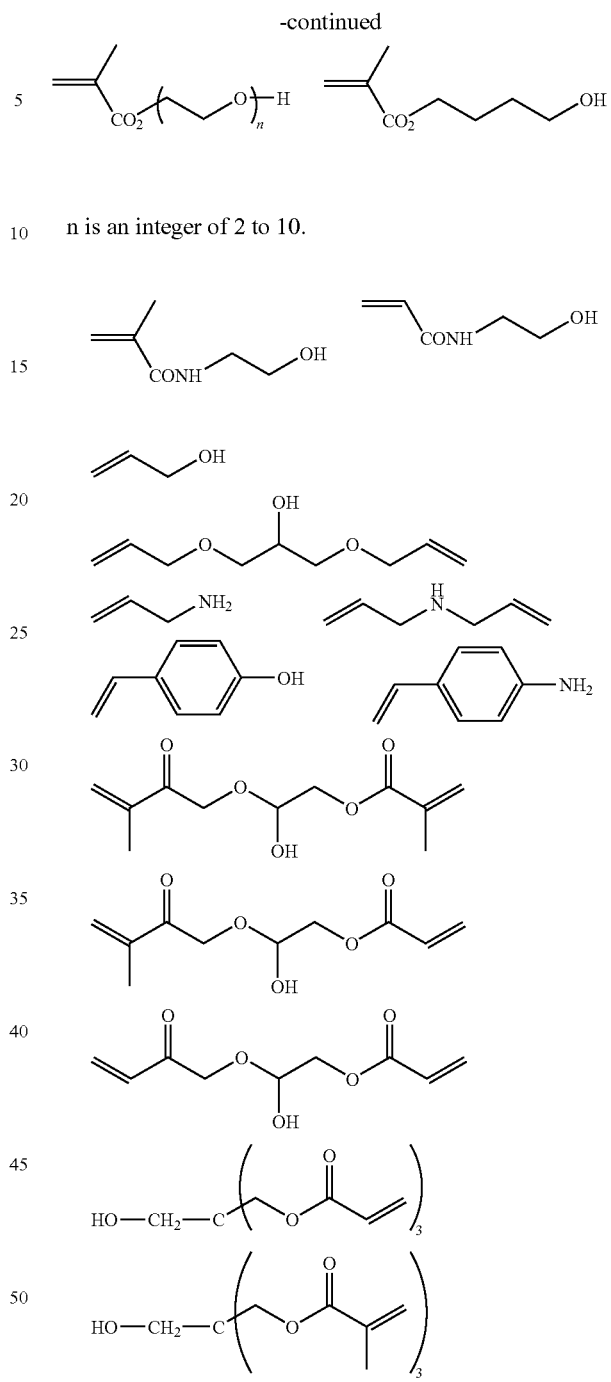
n is an integer of 2 to 10.
Examples of the monofunctional alcohol or monofunctional amine compound having a crosslinkable group are set forth below, but the invention should not be construed as being limited thereto.
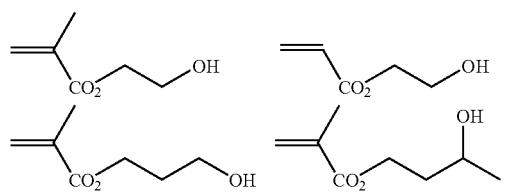
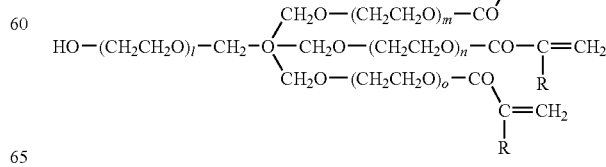

R is a hydrogen atom or a methyl group.
l, m, n and o each represents an integer of 1 to 20.

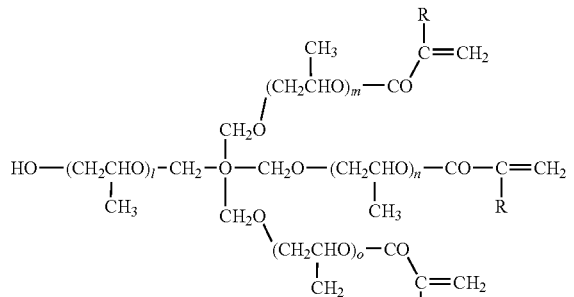

R is a hydrogen atom or a methyl group.
l, m, n and o each represents an integer of 1 to 20.

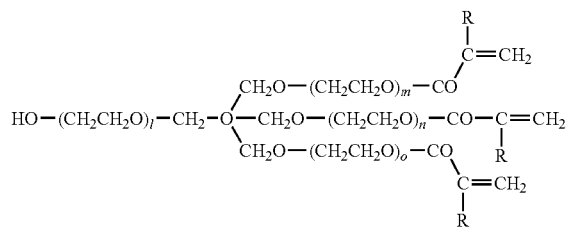

R is a hydrogen atom or a methyl group.
l, m, n and o each represents an integer of 1 to 20.

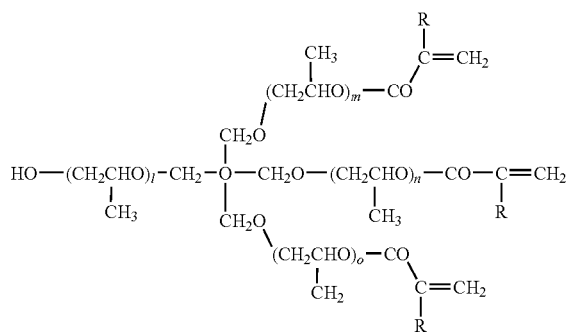

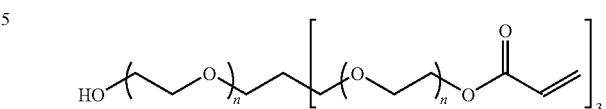

n is an integer of 1 to 20.

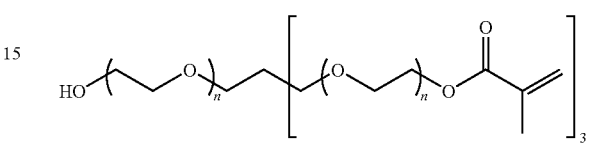

n is an integer of 1 to 20.

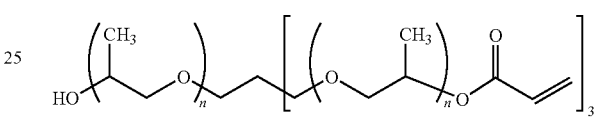

n is an integer of 1 to 20.

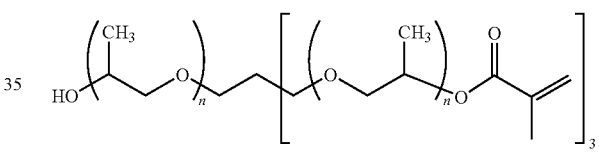

n is an integer of 1 to 20.

In order to introduce a crosslinkable group into the side chain of the polyurethane resin, a method of using as a raw material for the production of polyurethane resin, the diisocyanate compound having the crosslinkable group in the side chain is preferable. Specific examples of the diisocyanate compound having a crosslinkable group in the side chain obtained by an addition reaction of a triisocyanate compound with one equivalent of a monofunctional alcohol or monofunctional amine compound having the crosslinkable group are set forth below, but the invention should not be construed as being limited thereto.

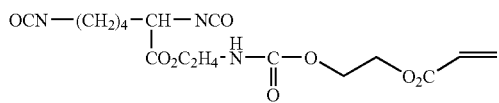

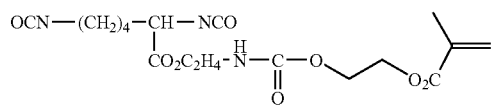

-continued
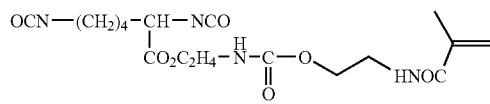
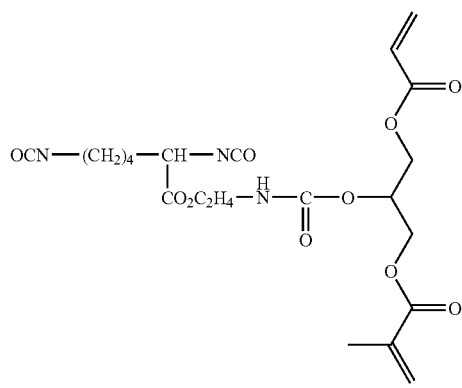
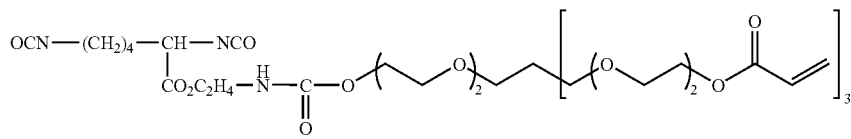
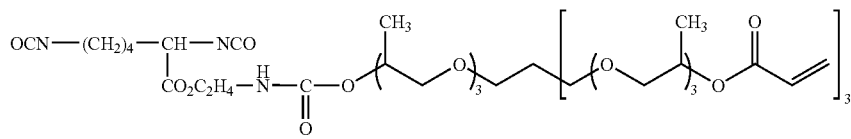
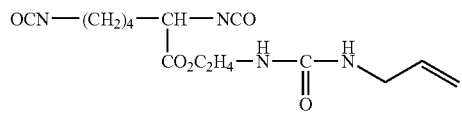
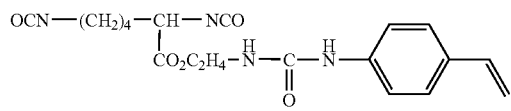
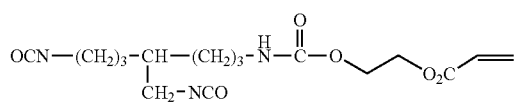
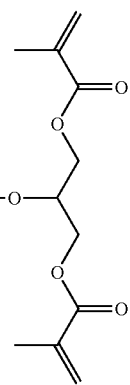
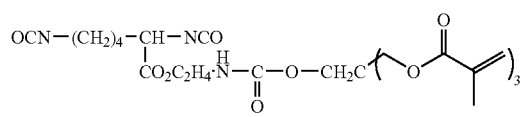
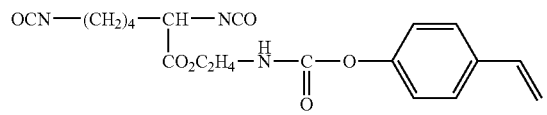
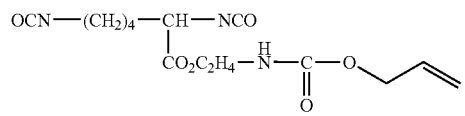
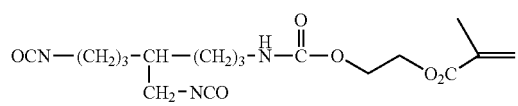

-continued
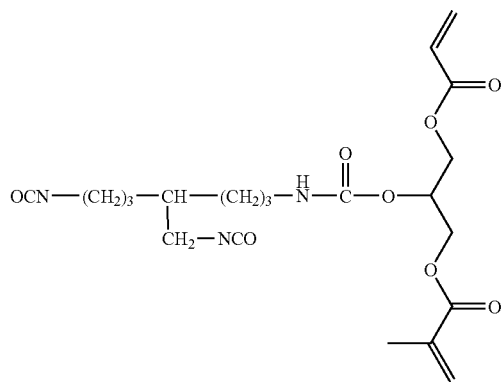
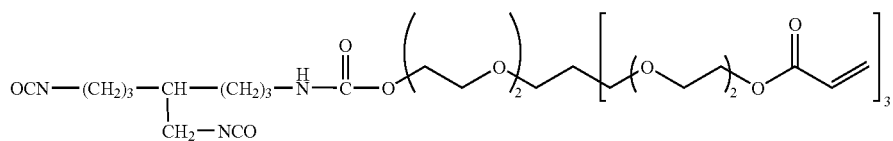
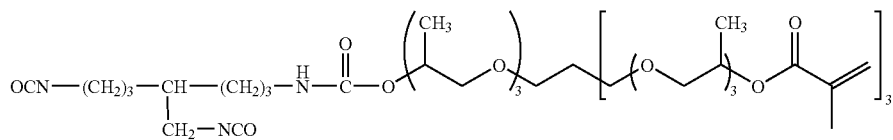
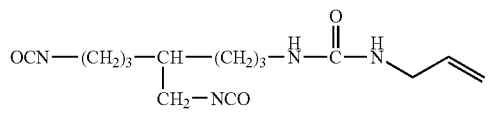
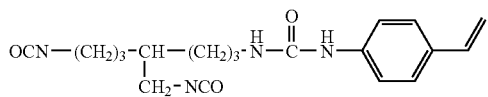
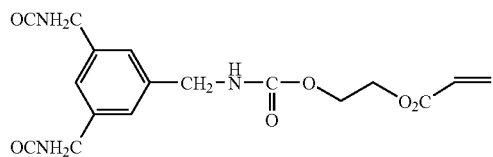
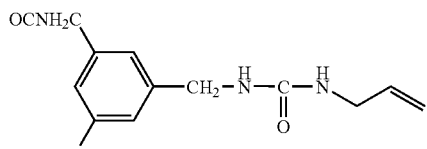
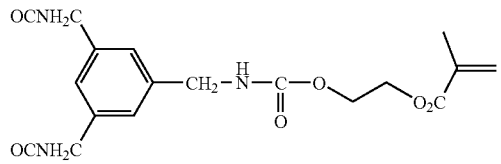
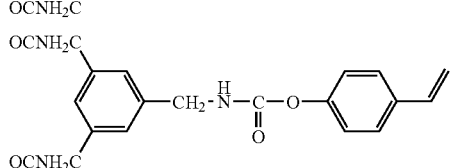
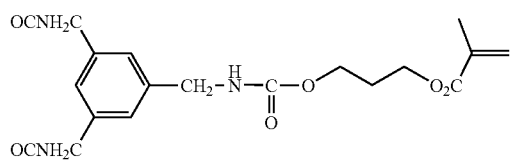
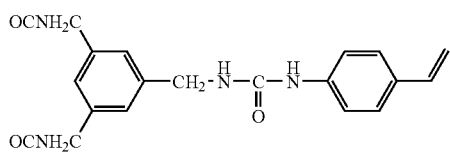
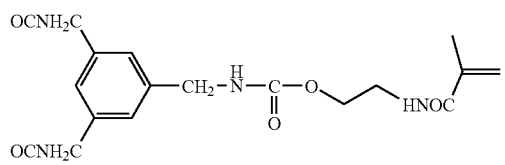

-continued
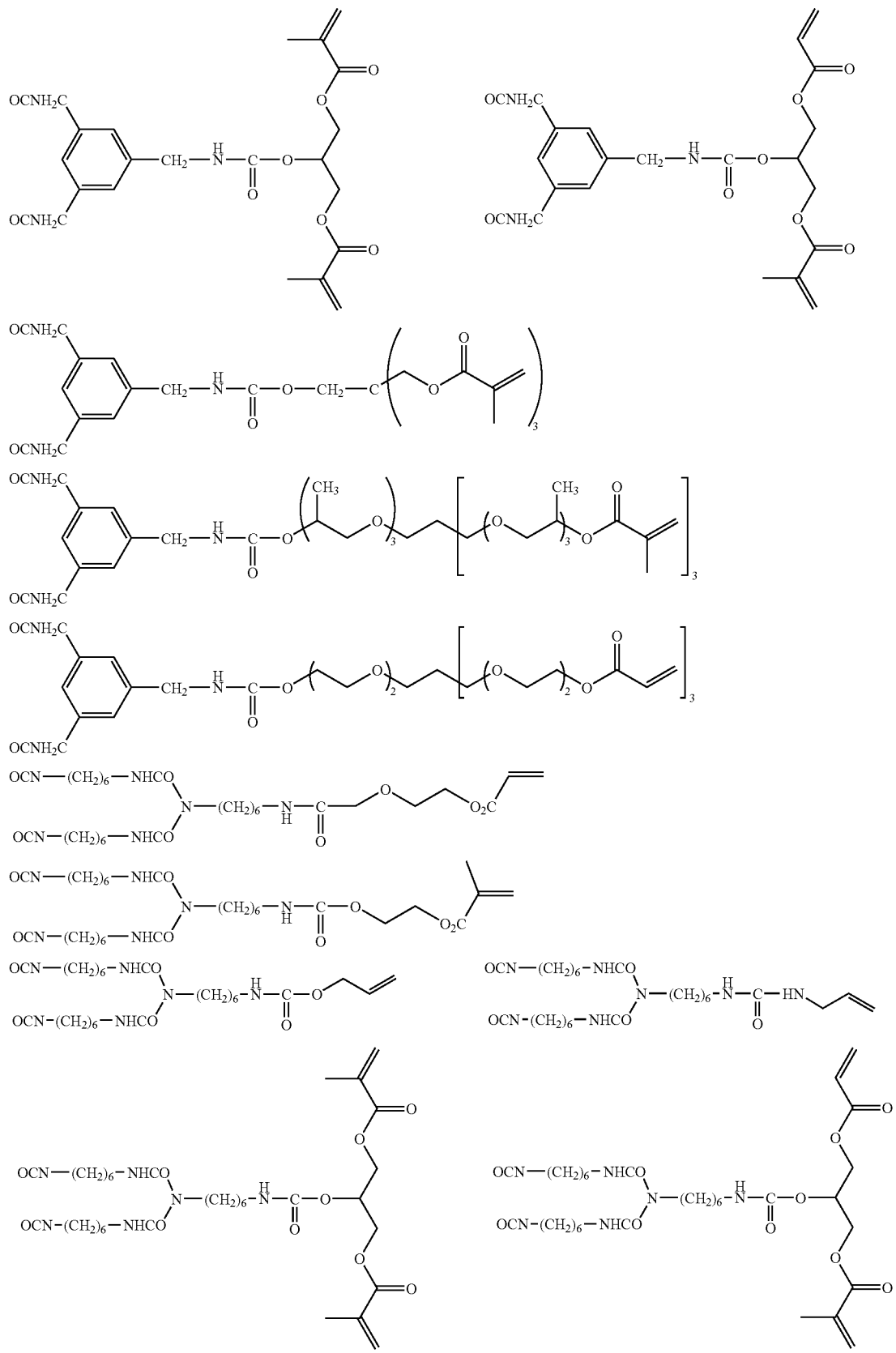

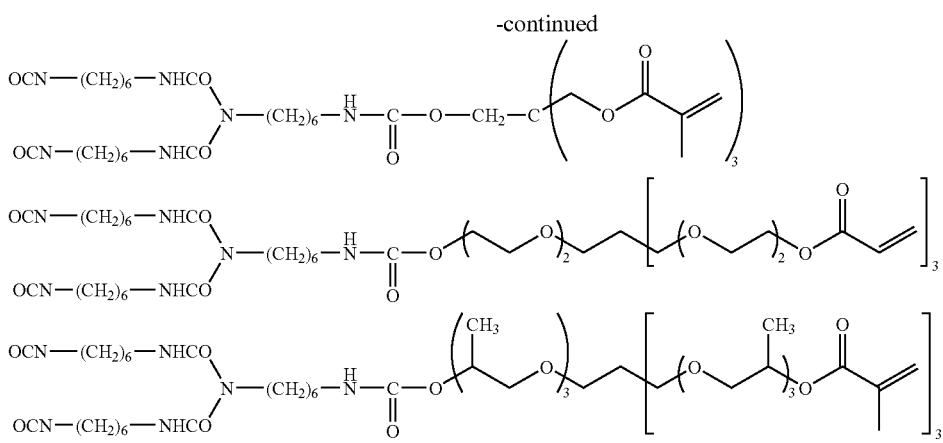

(iv) Other Diol Compound

A method of using a diol compound having a crosslinkable group in the side chain as a raw material for the production of polyurethane resin is preferable as well as the method described above for the purpose of introducing the crosslinkable group into the side chain of the polyurethane resin. Such a diol compound may be a commercially available compound, for example, trimethylolpropane monoallyl ether or a compound easily produced by a reaction of a halogenated diol compound, a triol compound or an aminodiol compound with a carboxylic acid, acid chloride, isocyanate, alcohol, amine, thiol or halogenated alkyl compound having a crosslinkable group. Specific examples of the diol compound having a crosslinkable group are set forth below, but the invention should not be construed as being limited thereto.

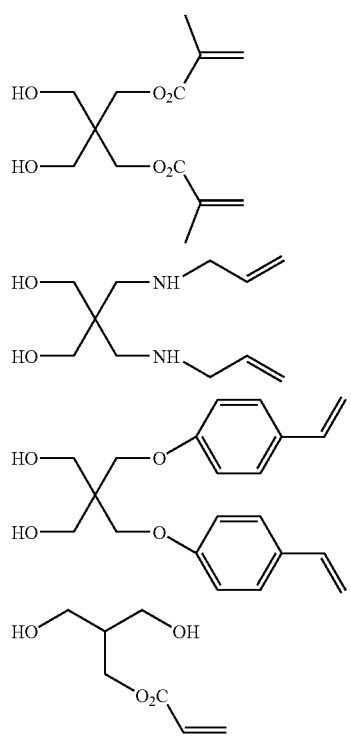

-continued

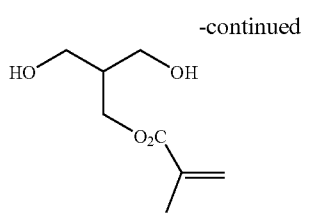

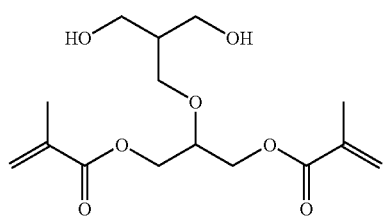

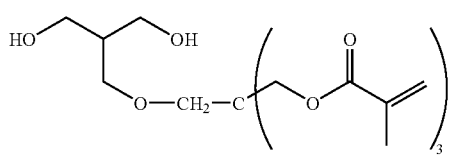

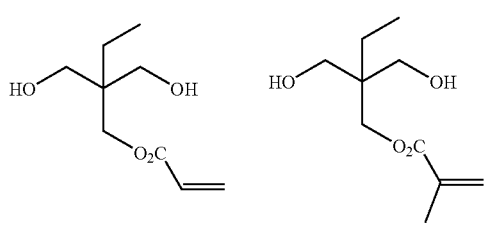

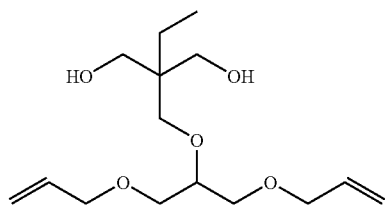

-continued
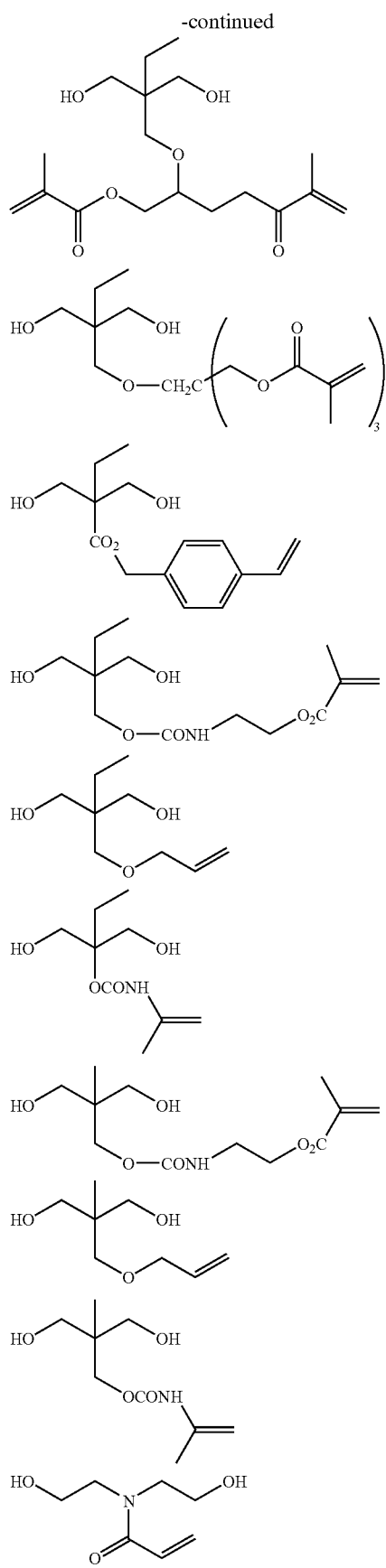
-continued
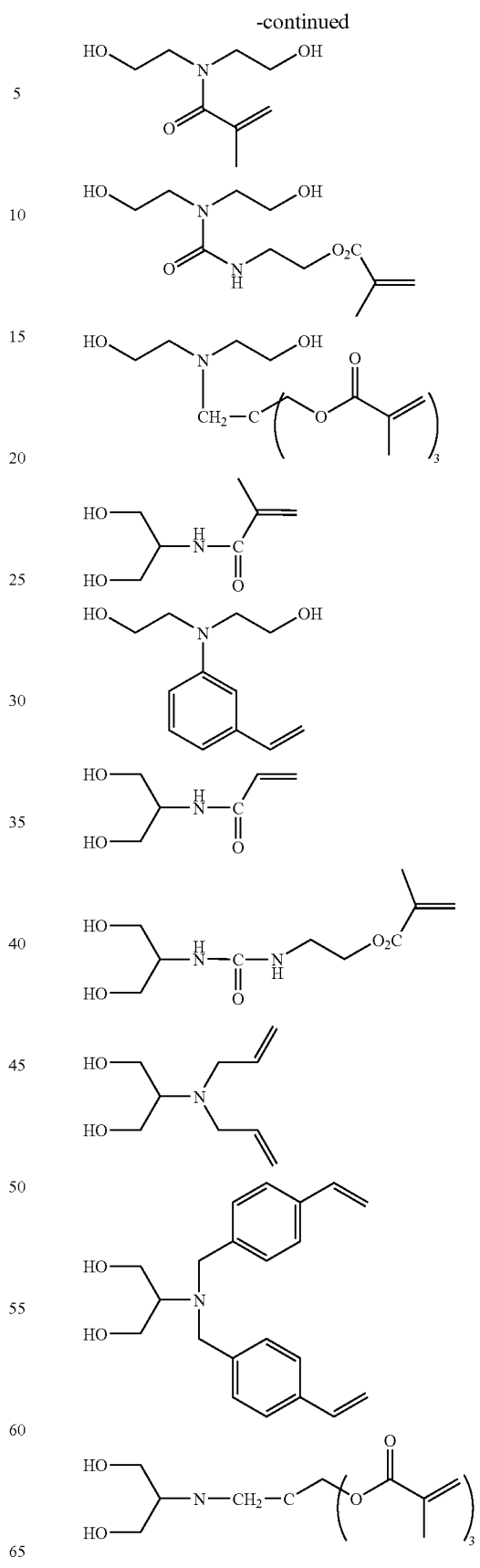

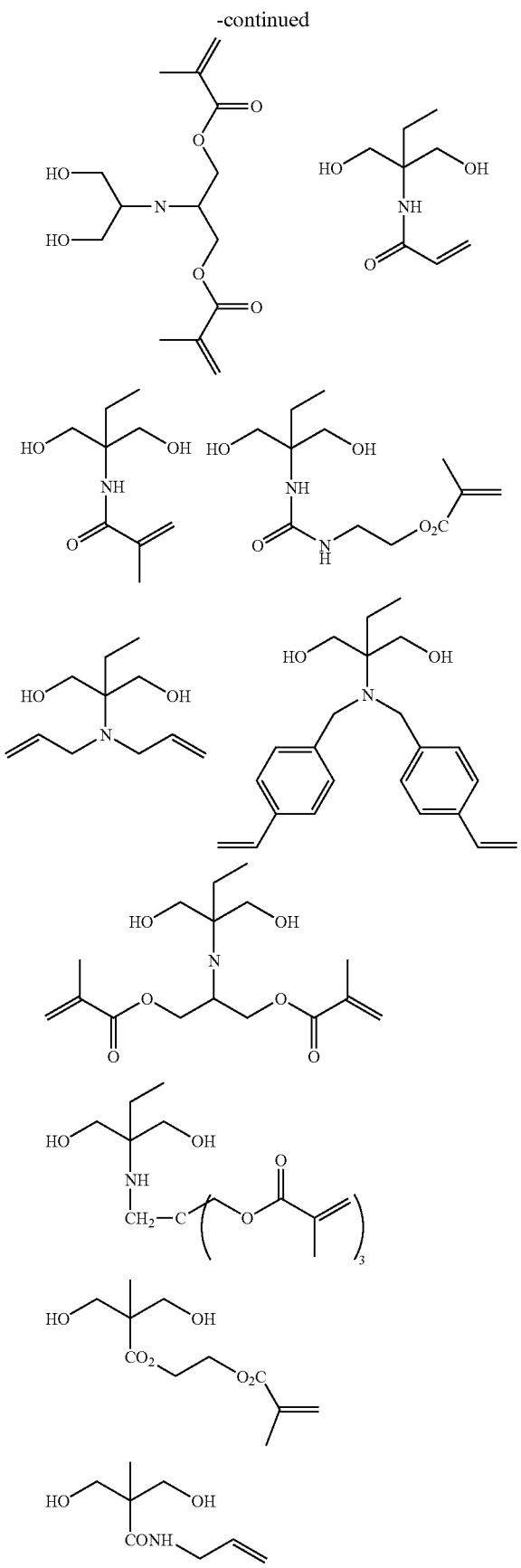

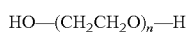

Another examples of the other diol compound include ethylene glycol compounds represented by the following formula (A'):

$$HO-(CH_2CH_2O)_n-H \qquad (A')$$

In the formula, n represents an integer of 1 or more.

Also, random copolymers and block copolymers between ethylene oxide and propylene oxide having hydroxy groups at the terminals are exemplified.

Further, an ethylene oxide adduct of bisphenol A (addition number of the ethylene oxide is from 27 to 100), an ethylene oxide adduct of bisphenol F (addition number of the ethylene oxide is from 22 to 100), an ethylene oxide adduct of hydrogenated bisphenol A (addition number of the ethylene oxide is from 23 to 100) and an ethylene oxide adduct of hydrogenated bisphenol F (addition number of the ethylene oxide is from 18 to 100) are also used. More specifically, the ethylene glycol compounds represented by formula (A') are preferable in view of the stain resistance. The ethylene glycol compounds represented by formula (A') wherein n is form 2 to 50 are more preferable, those wherein n is form 3 to 30 are still more preferable, and those wherein n is form 4 to 10 are particularly preferable.

Specific examples thereof include 1,2-propylene glycol, di-1,2-propylene glycol, tri-1,2-propylene glycol, tetra-1,2-propylene glycol, hexa-1,2-propylene glycol, 1,3-propylene glycol, di-1,3-propylene glycol, tri-1,3-propylene glycol, tetra-1,3-propylene glycol, 1,3-butylene glycol, di-1,3-butylene glycol, tri-1,3-butylene glycol, hexa-1,3-butylene glycol, polypropylene glycol having an average molecular weight of 400, polypropylene glycol having an average molecular weight of 700, polypropylene glycol having an average molecular weight of 1,000, polypropylene glycol having an average molecular weight of 2,000, polypropylene glycol having an average molecular weight of 3,000, polypropylene glycol having an average molecular weight of 4,000, neopentyl glycol 2-butene-1,4-diol, 2,2,4-trimethyl-1,3-pentanediol, 1,4-bis-β-hydroxyethoxycyclohexane, 1,4-butanediol, 1,5-pentanediol 1,6-hexanediol, 1,7-heptanediol, 1,8-octanediol, cyclohexanedimethanol, tricyclodecanedimethanol, hydrogenated bisphenol A, hydrogenated bisphenol F, an ethylene oxide adduct of bisphenol A (addition number of the ethylene oxide is 26 or less), an ethylene oxide adduct of bisphenol F (addition number of the ethylene oxide is 21 or less), an ethylene oxide adduct of hydrogenated bisphenol A (addition number of the ethylene oxide is 22 or less), an ethylene oxide adduct of hydrogenated bisphenol F (addition number of the ethylene oxide is 17 or less), a propylene oxide adduct of bisphenol A, a propylene oxide adduct of bisphenol F, a propylene oxide adduct of hydrogenated bisphenol A, a propylene oxide adduct of hydrogenated bisphenol F, hydroquinone dihydroxy ethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylenedicarbamate and bis(2-hydroxyethyl)isophthalate.

Further, polyether diol compounds of compounds represented by the following formulae (A), (B), (C), (D) and (E) are preferably used.

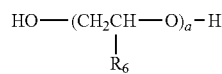  (A)

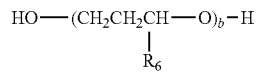  (B)

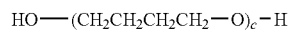  (C)

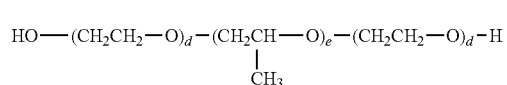  (D)

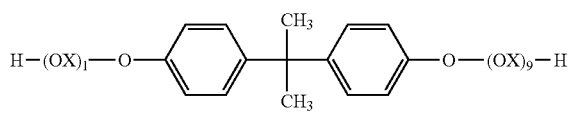  (E)

In the formulae, $R_6$ represents a hydrogen atom or a methyl group, provided that $R_6$ in formula (A) represents a methyl group. X represents a group shown below.

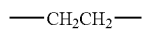   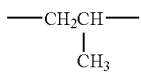

a, b, c, d, e, f and g each represents an integer of 2 or more, and preferably an integer of 2 to 100.

Polyester diol compounds represented by formulae (11) and (12) shown below are also enumerated as specific examples.

  (11)

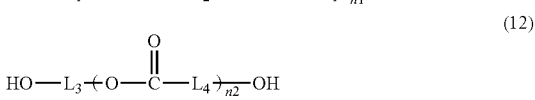  (12)

In the formulae, $L_1$, $L_2$ and $L_3$, which may be the same or different, each represents a divalent aliphatic or aromatic hydrocarbon group, and $L_4$ represents a divalent aliphatic hydrocarbon group. Preferably, $L_1$, $L_2$ and $L_3$ each represents an alkylene group, an alkenylene group, an alkynylene group or an arylene group, and $L_4$ represents an alkylene group. Also, $L_1$, $L_2$, $L_3$ and $L_4$ each may have other functional group which does not react with the isocyanate group, for example, an ether group, a carbonyl group, an ester group, a cyano group, an olefin group, a urethane group, an amido group, a ureido group or a halogen atom. n1 and n2 each represents an integer of 2 or more, and preferably an integer of 2 to 100.

Polycarbonate diol compounds represented by formula (13) shown below are also enumerated as specific examples.

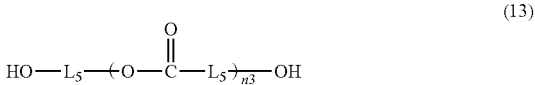  (13)

In the formula, $L_5$, which may be the same or different, each represents a divalent aliphatic or aromatic hydrocarbon group. Preferably, $L_5$ represents an alkylene group, an alkenylene group, an alkynylene group or an arylene group. Also, $L_5$ may have other functional group which does not react with the isocyanate group, for example, an ether group, a carbonyl group, an ester group, a cyano group, an olefin group, a urethane group, an amido group, a ureido group or a halogen atom. n3 represents an integer of 2 or more, and preferably an integer of 2 to 100.

Specific examples of the diol compound represented by formula (11), (12) or (13) include those shown below. In the specific examples, n represents an integer of 2 or more,

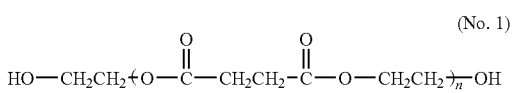  (No. 1)

  (No. 2)
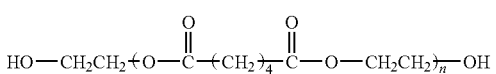

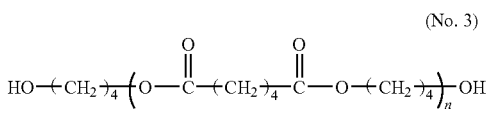  (No. 3)

  (No. 4)
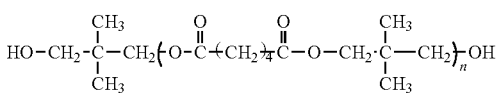

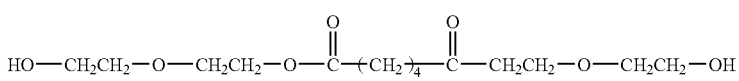  (No. 5)

  (No. 6)
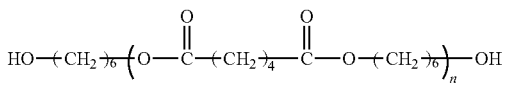

-continued

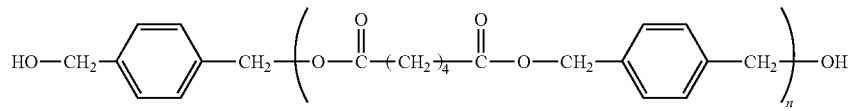
(No. 7)

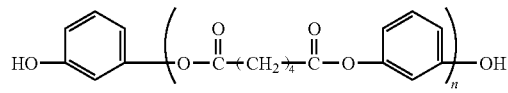
(No. 8)

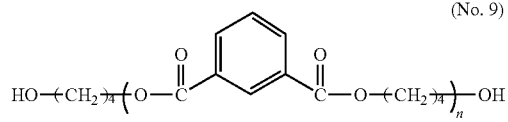
(No. 9)

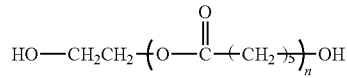
(No. 10)

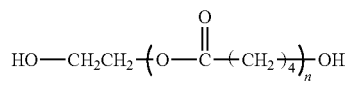
(No. 11)

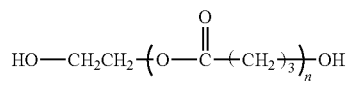
(No. 12)

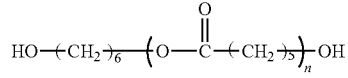
(No. 13)

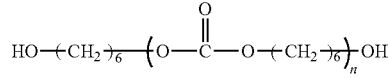
(No. 14)

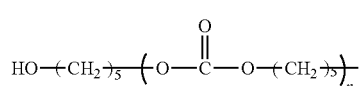
(No. 15)

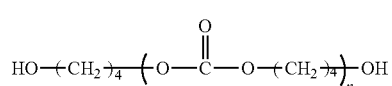
(No. 16)

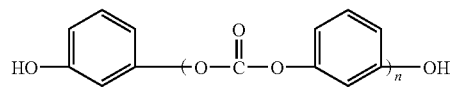
(No. 17)

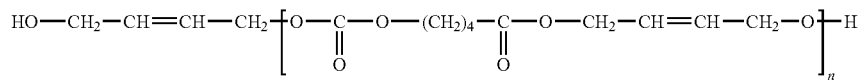
(No. 18)

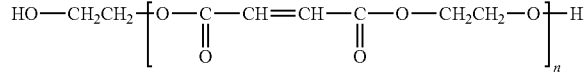
(No. 19)

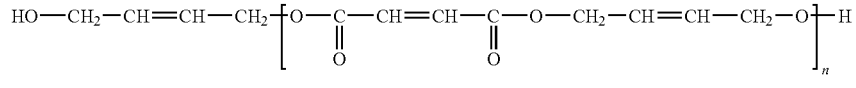
(No. 20)

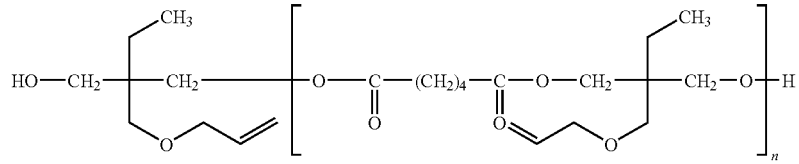
(No. 21)

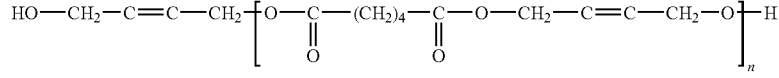
(No. 22)

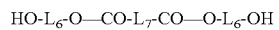
n = 2, 4

(No. 23)

Moreover, a diol compound that does not have a carboxy group and that may have other functional group which does not react with the isocyanate group may be used.

Examples of such a diol compound include those represented by formulae (14) and (15) shown below.

$$HO\text{-}L_6\text{-}O\text{—}CO\text{-}L_7\text{-}CO\text{—}O\text{-}L_6\text{-}OH \quad (14)$$

$$HO\text{-}L_7\text{-}CO\text{—}O\text{-}L_6\text{-}OH \quad (15)$$

In the formulae, $L_6$ and $L_7$, which may be the same or different, each represents a divalent aliphatic hydrocarbon group, aromatic hydrocarbon group or heterocyclic group, each of which may have a substituent (for example, an alkyl group, an aralkyl group, an aryl group, an alkoxy group, an aryloxy group or a halogen atom (e.g., —F, —Cl, —Br or —I)). $L_6$ and $L_7$ each may have other functional group which does not react with the isocyanate group, for example, a carbonyl group, an ester group, a urethane group, an amido group or a ureido group, if desired. Alternatively, $L_6$ and $L_7$ may be combined with each other to form a ring.

Specific examples of the diol compound represented by formula (14) or (15) include those shown below.

(No. 101) 1,2-bis(2-hydroxyethyl) benzenedicarboxylate (No. 102) 1,3-bis(2-hydroxyethyl) benzenedicarboxylate (No. 103) 1,4-bis(2-hydroxyethyl methyl) benzenedicarboxylate (No. 104) HO—CH₂CH₂—O—CO—(cyclopentadiene)—COO—CH₂CH₂—OH (No. 105) HO—CH₂CH₂-O-CO—CH=CH—COO—CH₂CH₂-OH (No. 106) HO—CH₂CH₂—O—COC₁₁H₂₂COO—CH₂CH₂—OH (No. 107) HO—CH₂CH₂—O—COC₁₂H₂₄COO—CH₂CH₂—OH (No. 108) HO—CH₂CH₂—O—COC₁₄H₂₆COO—CH₂CH₂—OH (No. 109) HO—CH₂CH₂-O-CO—C(CH₃)₂—COO—CH₂CH₂-OH (No. 110) HO—CH₂CH₂-O-CO—C≡C—COO—CH₂CH₂-OH (No. 111) HO—CH₂CH₂-O-CO—CH₂—C(CH₃)₂—COO—CH₂CH₂-OH—

(No. 112) 1,2-bis(2-hydroxyethyl) cyclohexanedicarboxylate (H)

(No. 113) HO—CH₂CH₂-O-CO—CH₂—O—CH₂—COO-CH₂CH₂-OH (No. 114) HO—CH₂CH₂-O-CO—CH₂—C(=CH₂)—COO—CH₂CH₂-OH (No. 115) HO—CH₂CH₂-O-CO—CH₂—N(CH₃)—CH₂—COO-CH₂CH₂-OH (No. 116) HO—CH₂CH₂-O-CO—CH₂CH₂C(=O)—COO—CH₂CH₂-OH (No. 117) HO—CH₂CH₂—O—CO-(pyridine-2,6-diyl)-COO—CH₂CH₂—OH (No. 118) 2,3-bis(2-hydroxyethyl) pyrazinedicarboxylate (No. 119) 1,3-bis(4-hydroxybutyl) benzenedicarboxylate (No. 120) HO-(phenyl)-COO—CH₂CH₂—OH (No. 121) 1-hydroxy-2-(2-hydroxyethyl) naphthalenecarboxylate (No. 122) HO-(phenyl)-CH=CH—COO—CH₂CH₂—OH -continued

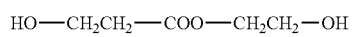 (No. 123)

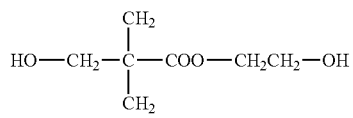 (No.124)

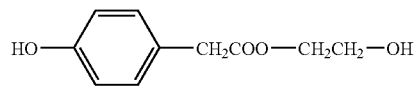 (No.125)

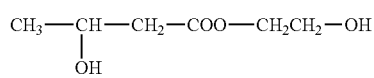 (No.126)

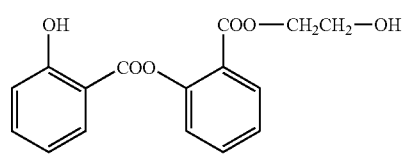 (No.127)

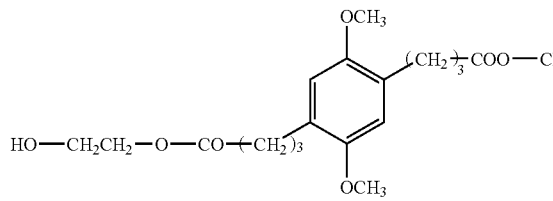 (No.128)

Moreover, diol compounds shown below are also preferably used.

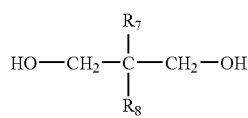 (16)

 (17)

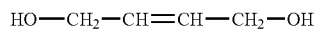 (18)

In the formulae, $R_7$ and $R_8$, which may be the same or different, each represents an alkyl group which may have a substituent, preferably an alkyl group having from 1 to 10 carbon atoms which may have a substituent (for example, a cyano group, a nitro group, a halogen atom (e.g., —F, —Cl, —Br or —I), —CONH$_2$, —COOR or —OR (wherein R, which may be the same or different, each represents an alkyl group having from 1 to 10 carbon atoms, an aryl group having from 7 to 15 carbon atoms or an aralkyl group)).

Specific examples of the diol compound represented by formula (16) include those shown below.

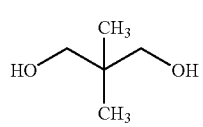

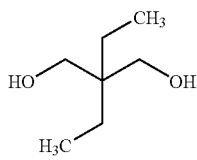

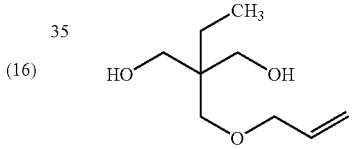

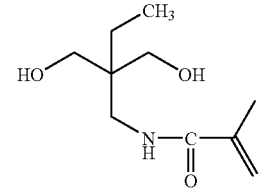

Example of the diol compound represented by formula (17) includes 2-butyne-1,4-diol. Examples of the diol compound represented by formula (18) include cis-2-butene-1,4-diol and trans-2-butene-1,4-diol.

Furthermore, diol compounds represented by formulae (19) and (20) shown below are also preferably used.

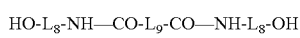 (19)

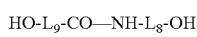 (20)

In the formulae, $L_8$ and $L_9$, which may be the same or different, each represents a divalent aliphatic hydrocarbon group, aromatic hydrocarbon group or heterocyclic group, each of which may have a substituent (for example, an alkyl group, an aralkyl group, an aryl group, an alkoxy group, an aryloxy group or a halogen atom (e.g., —F, —Cl, —Br or —I)). $L_8$ and $L_9$ each may have other functional group which does not react with the isocyanate group, for example, a carbonyl group, an ester group, a urethane group, an amido group or a ureido group, if desired. Alternatively, $L_8$ and $L_9$ may be combined with each other to form a ring.

Specific examples of the diol compound represented by formula (19) or (20) include those shown below.

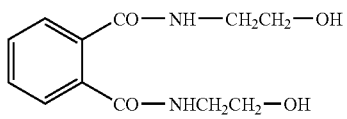 (No.201)
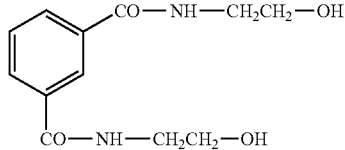 (No.202)
(No.203)
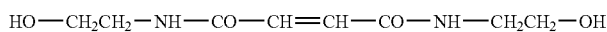
(No.204)
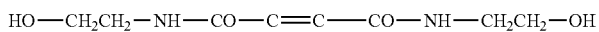
(No.205)
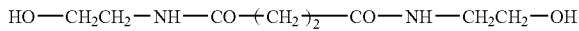
(No.206)
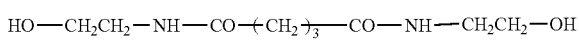
(No.207)
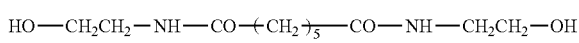
(No.208)
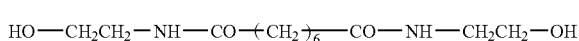
(No.209)
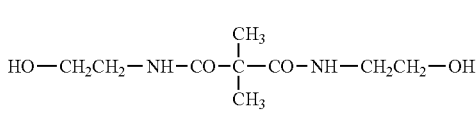
(No.210) 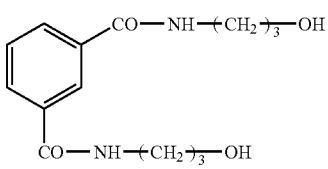 (No.211)
(No.212)
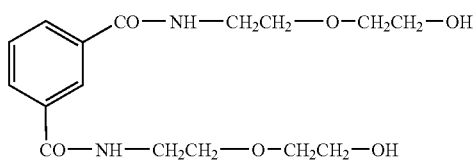
(No.213)
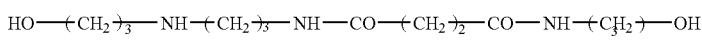
(No.214)
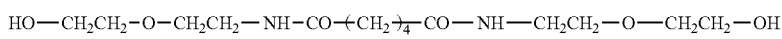
(No.215)
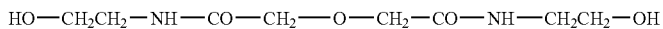
(No.216)
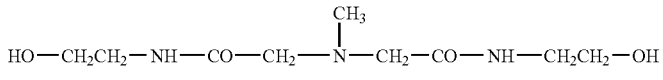
(No.217)
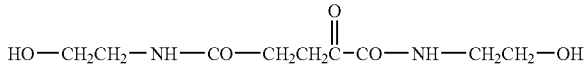
(No.218)
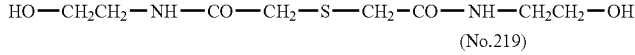
(No.219) 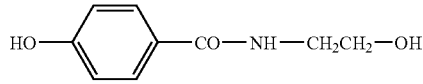 (No.220) 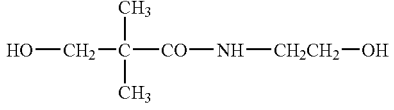

Furthermore, diol compounds represented by formulae (21) and (22) shown below are also preferably used.

$$HO—Ar_2-(L_{16}-Ar_3)_n—OH \quad (21)$$

$$HO—Ar_2-L_{16}-OH \quad (22)$$

In the formulae, $L_{16}$ represents a divalent aliphatic hydrocarbon group which may have a substituent (for example, an alkyl group, an aralkyl group, an aryl group, an alkoxy group, an aryloxy group or a halogen atom). $L_{16}$ may have other functional group which does not react with the isocyanate group, for example, an ester group, a urethane group, an amido group or a ureido group, if desired.

$Ar_2$ and $Ar_3$, which may be the same or different, each represents a divalent aromatic hydrocarbon group which may have a substituent, preferably an aromatic group having from 6 to 15 carbon atoms. n represents an integer of 0 to 10.

Specific examples of the diol compound represented by formula (21) or (22) include those shown below.

Specifically, catechol, resorcine, hydroquinone, 4-methylcatechol, 4-tert-butylcatechol, 4-acetylcatechol, 3-methoxycatechol, 4-phenylcatechol, 4-methylresorcine, 4-ethylresorcine, 4-tert-butylresorcine, 4-hexylresorcine, 4-chlororesorcine, 4-benzylresorcine, 4-acetylresorcine, 4-carboxymethoxyresorcine, 2-methylresorcine, 5-methylresorcine, tert-butylhydroquinone, 2,5-di-tert-butylhydroquinone, 2,5-di-tert-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybezyl alcohol, 4-hydroxybezyl alcohol, 2-hydroxy-3,5-di-tert-butylbezyl alcohol, 4-hydroxy-3,5-di-tert-butylbezyl alcohol, 4-hydroxyphenethyl alcohol, 2-hydroxyethyl-4-hydroxybenzoate, 2-hydroxyethyl-4-hydroxyphenylacetate and resorcine mono-2-hydroxyethyl ether are exemplified. Diol compounds shown below are also preferably used.

(v) Other Amino Group-Containing Compound

In the polyurethane resin binder according to the invention, an amino group-containing compound represented by formula (31) or (32) shown below may be used together to react with the diisocyanate compound, thereby forming a urea structure to incorporate into the polyurethane resin.

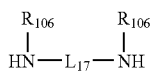

(31)

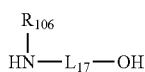

(32)

In the formulae, $R_{106}$ and $R_{106}'$, which may be the same or different, each represents a hydrogen atom, an alkyl group, an aralkyl group or an aryl group, each of which may have a substituent (for example, an alkoxy group, a halogen atom (e.g., —F, —Cl, —Br or —I), an ester group or a carboxy group); and preferably a hydrogen atom, an alkyl group having from 1 to 8 carbon atoms or an aryl group having from 6 to 15 carbon atoms, each of which may have a carboxy group as a substituent, $L_{17}$ represents a divalent aliphatic hydrocarbon group, aromatic hydrocarbon group or heterocyclic group, each of which may have a substituent (for example, an alkyl group, an aralkyl group, an aryl group, an alkoxy group, an aryloxy group, a halogen atom (e.g., —F, —Cl, —Br or —I) or a carboxy group), $L_{17}$ may have other functional group which does not react with the isocyanate group, for example, a carbonyl group, an ester group, a urethane group or an amido group, if desired. Alternatively, two of $R_{106}$, $L_{17}$ and $R_{106}'$ may be combined with each other to form a ring.

Specific examples of the compound represented by formula (31) or (32) include the following compounds.

Specifically, aliphatic diamine compounds, for example, ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine or isophorondiamine) aromatic diamine compounds, for example, o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl)sulfone, 4-carboxy-o-phenylenediamine, 3-carboxy-m-phenylenediamine, 4,4'-diaminophenyl ether or 1,8-naphthalenediamine; heterocyclic amine compounds, for example, 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-S-triazine, 2,6-diaminopyridine, L-hystidine, DL-tryptophan or adenine and aminoalcohol or aminophenol compounds, for example, ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol or L-tyrosine are enumerated.

A polyurethane resin obtained by introducing a crosslinkable group into polyurethane having a carboxy group by a polymer reaction as described in JP-A-2003-270775 may also be used as the polymer binder according to the invention as well as the above-described polyurethane resin, obtained by introducing a crosslinkable group into a side chain at the synthesis of polyurethane.

A molecular weight of the polymer binder used in the invention is appropriately determined in view of the image-forming property and printing durability. The molecular weight is preferably in a range from 2,000 to 1,000,000, more preferably from 5,000 to 500,000, and still more preferably from 10,000 to 200,000.

The polymer binders may be used individually or in combination of two or more thereof in the invention. Further, the polymer binder according to the invention may be used together with one or more other binder polymers having no crosslinkable group. As the binder polymer used together, conventionally known alkali-soluble or alkali-swellable binders are employed without any limitation. Specifically, for example, acryl main chain binders and urethane binders conventionally used in the field of art can be preferably employed.

The total amount of the polymer binder and binder polymer which may be used together in the photosensitive layer can be appropriately determined. It is, however, ordinarily in a range from 10 to 90% by weight, preferably from 20 to 80% by weight, and more preferably from 30 to 70% by weight, based on the total weight of the nonvolatile components in the photosensitive layer.

[Polymerization Initiator]

The polymerization initiator for use in the invention is preferably at least one compound selected from the group consisting of a hexaarylbiimidazole compound, an onium salt, a trihalomethyl compound and a metallocene compound, and particularly preferably the hexaarylbiimidazole compound.

The hexaarylbiimidazole polymerization initiator includes, for example, lophine dimers described in JP-B-45-37377 and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The trihalomethyl compound preferably includes trihalomethyl-s-triazines, and specifically s-triazine derivatives having a trihalogen-substituted methyl group described in JP-A-58-29803, for example, 2,4,6-tris(trichloromethyl)-s-triazine, 2-methoxy-4,6-bis(trichloromethyl)-s-triazine, 2-amino-4,6-bis(trichloromethyl)-s-triazine and 2-(p-methoxystyryl)-4,6-bis(trichloromethyl)-s-triazine.

The onium salt includes, for example, onium salts represented by the following formula (IV);

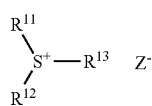

(IV)

In formula (IV), $R^{11}$, $R^{12}$ and $R^{13}$, which may be the same or different, each represents a hydrocarbon group having 20 or less carbon atoms which may have a substituent. Preferred examples of the substituent include a halogen atom, a nitro group, an alkyl group having 12 or less carbon atoms, an alkoxy group having 12 or less carbon atoms and an aryloxy group having 12 or less carbon atoms. $Z^-$ represents a counter ion selected from the group consisting of a halogen ion, a perchlorate ion, a tetrafluoroborate ion, a hexafluorophosphate ion, a carboxylate ion and a sulfonate ion, and preferably a perchlorate ion, a hexafluorophosphate ion, a carboxylate ion or an arylsulfonate ion.

The titanocene compound can be used by appropriately selecting, for example, from known compounds as described in JP-A-59-152396 and JP-A-61-151197. Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2, 3,5,6-tetrafluorophen-1-yl) dimethylcyclopentadienyl-Ti-bis-2,4-difluorophen-1-yl and bis(cyclopentadienyl)-bis-(2, 6-difluoro-3-(pyr-1-lyl)phenyl)titanium.

The polymerization initiators are preferably used individually or as a mixture of two or more thereof in the invention.

An amount of the polymerization initiator used in the invention is preferably from 0.01 to 20% by weight, more preferably from 0.1 to 15% by weight, and still more preferably from 1.0 to 10% by weight, based on the total solid content of the photosensitive layer.

[Sensitizing Dye]

The photosensitive layer according to the invention can contain a sensitizing dye responding to a wavelength of an exposure light source.

Sensitizing dyes having an absorption maximum in a wavelength range of 300 to 500 nm are described at the beginning. Examples of the sensitizing dye include merocyanine dyes represented by formula (V) shown below, benzopyranes represented by formula (VI) shown below, coumarins, aromatic ketones represented by formula (VII) shown below, and anthracenes represented by formula (VIII) shown below.

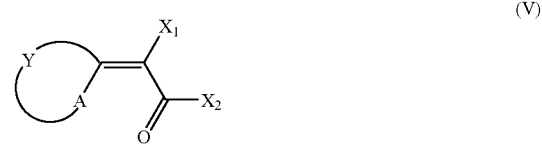

(V)

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

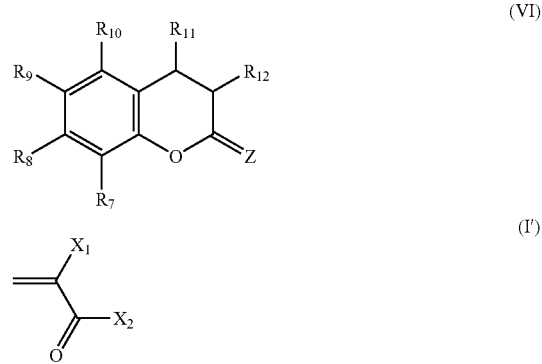

(VI)

(I')

In formula (VI), =Z represents a carbonyl group, a thiocarbonyl group, all imino group or an alkylydene group represented by the partial structural formula (I') described above, $X_1$ and $X_2$ have the same meanings as defined in formula (V), and $R_7$ to $R_{12}$ each independently represents a monovalent non-metallic atomic group.

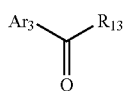 (VII)

In formula (VII), Ar₃ represents an aromatic group which may have a substituent or a heteroaromatic group which may have a substituent, and $R_{13}$ represents a monovalent non-metallic atomic group. $R_{13}$ more preferably represents an aromatic group or a heteroaromatic group. Ar₃ and $R_{13}$ may be combined with each other to form a ring.

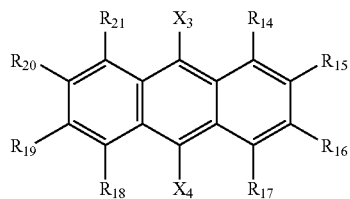 (VIII)

In formula (VII) $X_3$, $X_4$ and $R_{14}$ to $R_{21}$ each independently represents a monovalent non-metallic atomic group. More preferably, $X_3$ and $X_4$ each independently represents an electron-donating group having a negative Hammett substituent constant.

In formulae (V) to (VIII), preferred examples of the monovalent non-metallic atomic group represented by $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methyl-carbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group or a phosphonatophenyl group), a heteroaryl group (for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indoyl, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO₃H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugated base group (hereinafter referred to as an "alkylphosphonato group"), a monoarylphosphono group (—$PO_3H$(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "akylphosphonatooxy group"), a monoarylphosphonooxy group (—$OPO_3H$(aryl)) and its conjugated base group (hereinafter referred to as an "arylphosphonatooxy group"), a cyano group, and a nitro group. Of the substituents, a hydroxy group, an alkyl group, an aryl group) a halogen atom, an alkoxy group and an acyl group are particularly preferred.

The basic nucleus of the dye formed by Y together with the adjacent A and the adjacent carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole) or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianapheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-pheylbenzimidazole); 3,3-dialkylindolenines (for example, 3,3-dimethylindolenine, 3,3,5-trimethylindolenine or 3,3,7-trimethylindolenine); 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 360 to 450 nm, dyes represented by formula (IX) shown below are more preferred in view of high sensitivity.

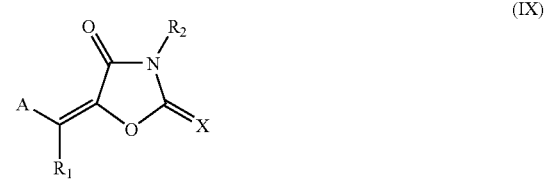

(IX)

In formula (IX), A represents an aromatic ring which may have a substituent or a hetero ring which may have a substituent, X represents an oxygen atom, a sulfur atom or N—($R_3$), and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic group, a substituted or unsubstituted alkoxy group, a substituted or unsubstituted alkylthio group, a hydroxy group or a halogen atom.

Preferred examples of $R_1$, $R_2$ and $R_3$ will be specifically described below. Preferred examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferred examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl))$_2$, a diarylphosphonooxy group (—OPO$_3$(aryl))$_2$, an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group) a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group.

Preferred examples of the aromatic heterocyclic group represented by any one of $R_1$, $R_2$ and $R_3$ include a monocyclic or polycyclic aromatic ring containing at least one of a nitrogen atom, an oxygen atom and a sulfur atom. Examples of especially preferred aromatic heterocyclic group include thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indoyl, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane and phenoxazine. These groups may be benzo-fused or may have a substituent.

Also, preferred examples of the alkenyl group represented by any one of $R_1$, $R_2$ and $R_3$ include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferred alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferred substituted alkyl group represented by any one of $R_1$, $R_2$ and $R_3$ which is obtained by combining the above-described substituent with an alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methyl-carbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferred examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferred substituted aryl group represented by any one of $R_1$, $R_2$ and $R_3$ include aryl groups having a monovalent non-metallic atomic group exclusive of a hydrogen atom as a substituent on the ring-forming carbon atom of the above-described art group. Preferred examples of the substituent include the above-described alkyl groups and substituted alkyl groups, and the substituents described for the above-described substituted alkyl group. Specific examples of the preferred substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propenylphenyl group, a 2-butynylphenyl group and a 3-butynylphenyl group.

Next, A in formula (IX) will be described below. A represents an aromatic ring which may have a substituent or hetero ring which may have a substituent. Specific examples of the aromatic ring which may have a substituent or hetero ring which may have a substituent include those described for any one of $R_1$, $R_2$ and $R_3$ in formula (IX).

The sensitizing dye represented by formula (IX) according to the invention is obtained by a condensation reaction of the above-described acidic nucleus or an active methyl group-containing acidic nucleus with a substituted or unsubstituted, aromatic ring or hetero ring and can be synthesized with reference to JP-B-59-28329.

Preferred specific examples (D1) to (D38) of the compound represented by formula (IX) are set forth below. Also, when isomers with respect to a double bond connecting an acidic nucleus and a basic nucleus are present, the invention should not be construed as being limited to any one of the isomers.

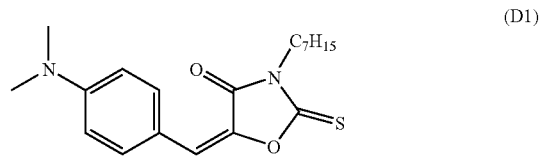

(D1)

-continued
(D2) 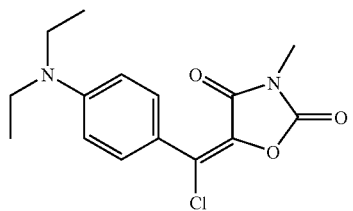
(D3) 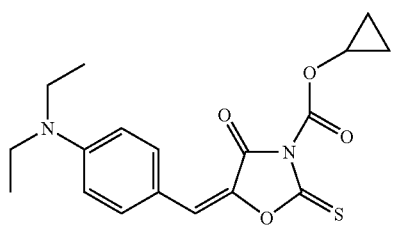
(D4) 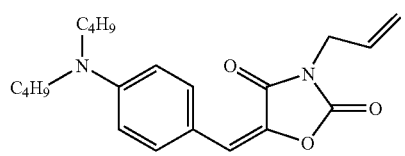
(D5) 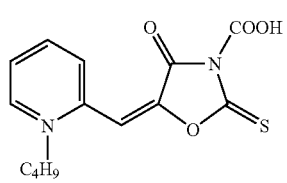
(D6) 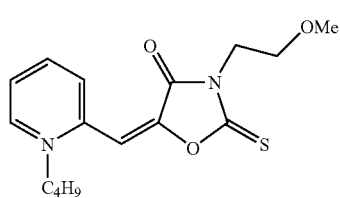
(D7) 
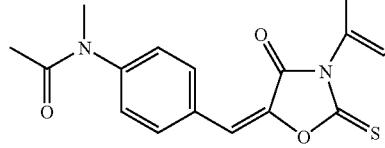
(D8) 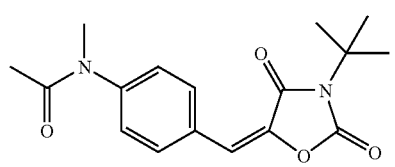
-continued
(D9) 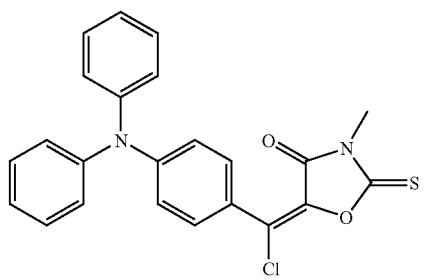
(D10) 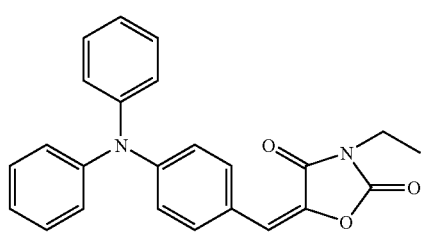
(D11) 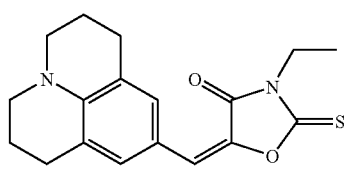
(D12) 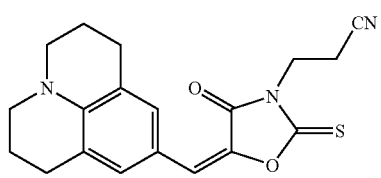
(D13) 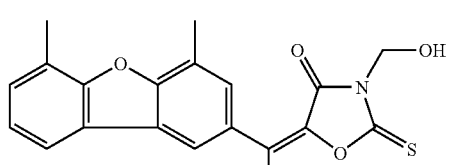
(D14) 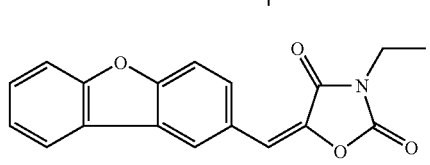
(D15) 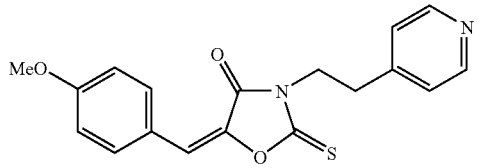
(D16) 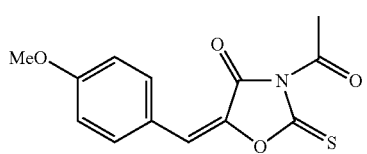

-continued
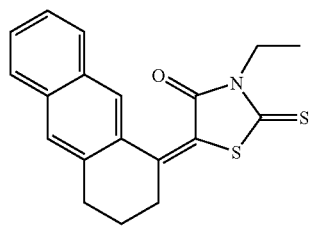 (D17)
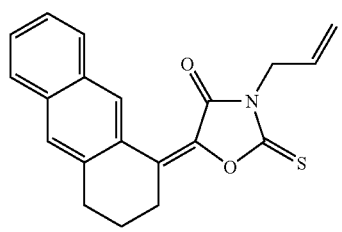 (D18)
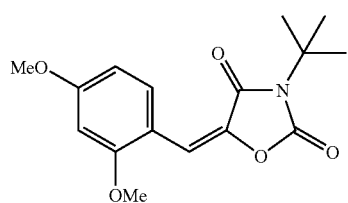 (D19)
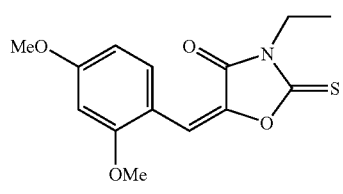 (D20)
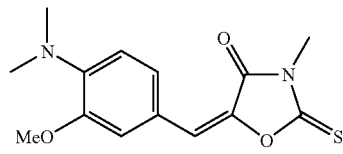 (D21)
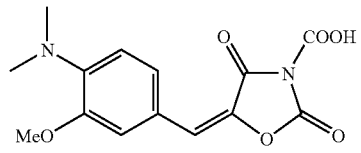 (D22)
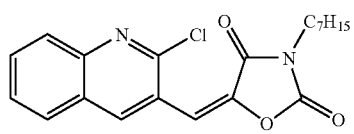 (D23)
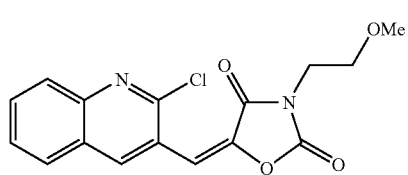 (D24)
-continued
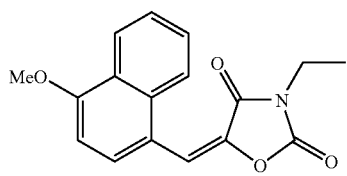 (D25)
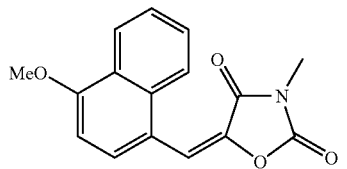 (D26)
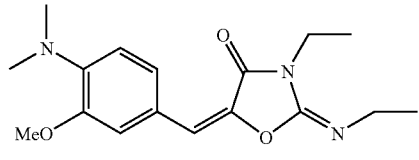 (D27)
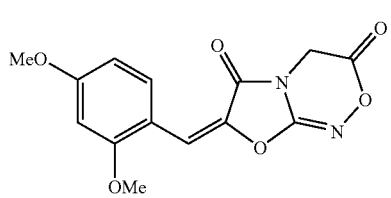 (D28)
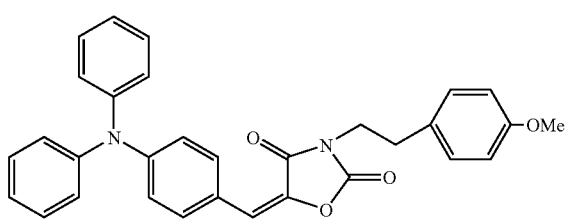 (D29)
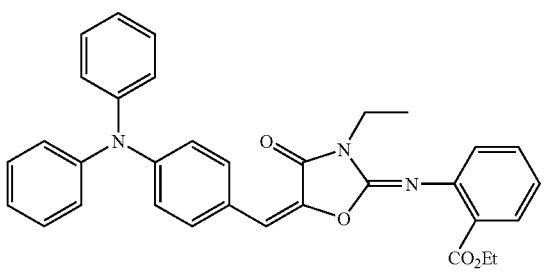 (D30)
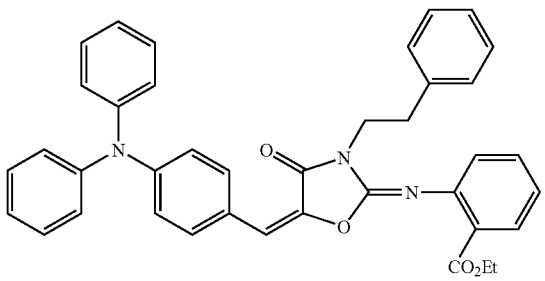 (D31)

-continued (D32)
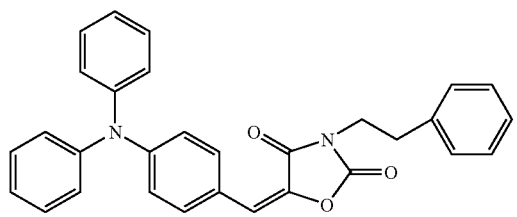

(D33)
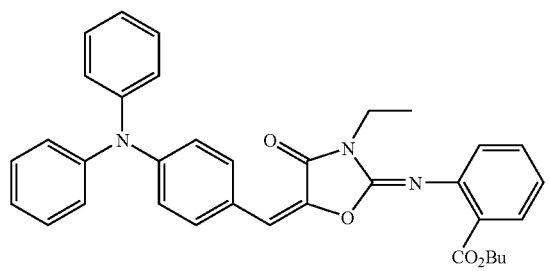

(D34)
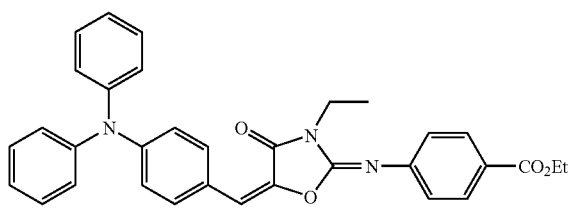

(D35)
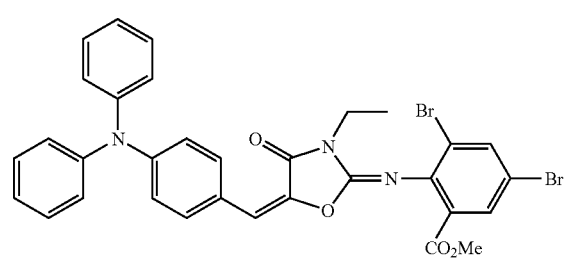

(D36)
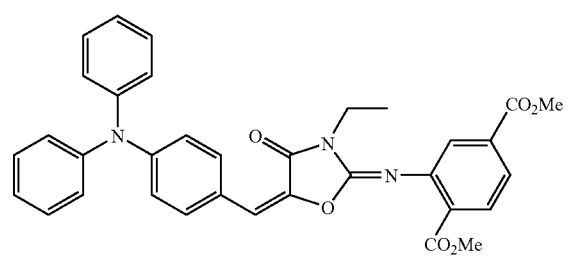

-continued (D37)
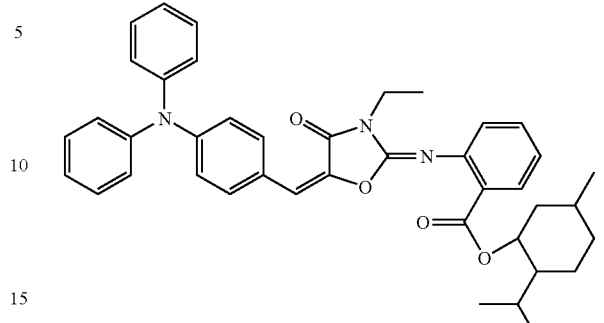

(D38)
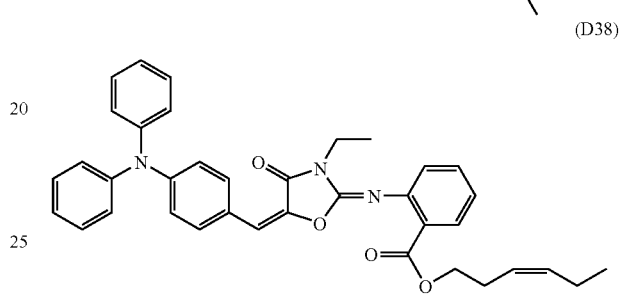

[Thermal Polymerization Inhibitor]

In the invention, it is preferred to add a small amount of a thermal polymerization inhibitor in addition to the above-described basic components, in order to prevent the compound having a polymerizable ethylenically unsaturated bond from undergoing undesirable thermal polymerization during the production or preservation of the photosensitive lithographic printing plate. Suitable examples of the thermal polymerization inhibitor include hydroquinone, p-methoxyphenol, di-tert-butyl-p-cresol, pyrogallol, tert-butylcatechol, benzoquinone, 4,4-thiobis(3-methyl-6-tert-butylphenol), 2,2'-methylenebis(4-methyl-6-tert-butylphenol), N-nitrosophenylhydroxyamine cerium(III) salt and N-nitrosophenylhydroxylamine aluminum salt.

An amount of the thermal polymerization inhibitor added is preferably from about 0.01 to about 5% by weight, based on the total solid content of the photosensitive layer.

[Other Additives]

If desired, in order to prevent polymerization inhibition due to oxygen, a higher fatty acid derivative, for example, behenic acid or behenic amide may be added and allowed to localize on the photosensitive layer surface during the drying step after the coating thereof. An amount of the higher fatty acid derivative added is preferably from about 0.5 to about 10% by weight based on the total solid content of the photosensitive layer.

Further, for the purpose of coloring the photosensitive layer, a coloring agent may be added. Examples of the coloring agent include phthalocyanine pigments (for example, C.I. Pigment Blue 15:3, C.I. Pigment Blue 15:4 or C.I Pigment Blue 15:6), azo pigments, pigments, for example, carbon black or titanium oxide, Ethyl Violet, Crystal Violet, no dyes, anthraquinone dyes and cyanine dyes. An amount of the dye or pigment added is preferably from about 0.5 to about 20% by weight of the total solid content of the photosensitive layer. In addition, for the purpose of improving physical properties of the cured film, an additive, for example, an inorganic filler or a plasticizer (for example, dioctyl phthalate, dimethyl phthalate or tricresyl phosphate) may be added. The amount of the additive added is preferably 10% by weight or less of the total solid content of the photosensitive layer.

[Support]

As the hydrophilic support for use in the invention, conventionally known hydrophilic supports employed for lithographic printing plates can be used without any limitation. The support used is preferably a dimensionally stable plate-like material for example, paper, paper laminated with plastic (e.g., polyethylene, polypropylene or polystyrene), a metal plate (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film having laminated with or vapor-deposited thereon the above-described metal. If desired, the surface of the support may be subjected to an appropriate known physical or chemical treatment for the purpose of imparting hydrophilicity, increasing strength or the like.

Preferred examples of the support include paper, a polyester film and an aluminum plate. Among them, the aluminum plate is particularly preferred, because it has good dimensional stability, is relatively inexpensive and can provide a surface having excellent hydrophilicity and strength by a surface treatment as needed. Also, a composite sheet comprising a polyethylene terephthalate film having bonded thereon an aluminum sheet described in JP-B-48-18327 is preferred.

The aluminum substrate is a dimensionally stable metal plate comprising aluminum as a main component, and is selected from a pure aluminum plate, an alloy plate comprising aluminum as a main component and containing trace of foreign elements and a plastic film or paper laminated with or having vapor-deposited thereon aluminum (or alloy thereof).

In the description below, the substrate comprising aluminum or aluminum alloy described above is collectively referred to as an aluminum substrate. Examples of the foreign element contained in the aluminum alloy include silicon, iron, manganese, copper, magnesium, chromium, zinc, bismuth, nickel and titanium. The content of foreign element in the alloy is at most 10% by weight. Although a pure aluminum palate is preferable in the invention, an aluminum plate containing trace of foreign elements may be used, because perfectly pure aluminum is difficult to produce in view of the refining technique, The composition of the aluminum plate for use in the invention is not limited and aluminum plates comprising conventionally known and used materials, for example, JIS A 1050, JIS A 1100, JIS A 3103 or JIS A 3005 can be appropriately used. The thickness of the aluminum substrate for use in the invention is approximately from 0.1 to 0.6 mm, preferably from 0.15 to 0.4 mm, and particularly preferably from 0.2 to 0.3 mm. The thickness can be appropriately changed depending upon the size of a printing machine, the size of a printing plate and the demands of users. The aluminum substrate may or may not be subjected to a surface treatment for the substrate described hereinafter.

The aluminum substrate is ordinarily subjected to a surface roughening treatment. The surface roughening method includes a method of mechanically roughening the surface, a method of chemical etching and a method of electrolytic graining, as described in JP-A-56-28893. Further, there may be employed an electrochemically surface roughening method of electrochemically roughening the surface in an electrolytic solution of hydrochloric acid or nitric acid and a mechanically surface roughening methods for example, a wire brush graining method of scratching the aluminum surface with a metal wire, a ball graining method of graining the aluminum surface with graining balls and an abrasive and a brush graining method of roughening the surface with a nylon brush and an abrasive. The surface roughening methods may be employed individually or in combination thereof. Of the methods, the electrochemical method of chemically roughening the surface in an electrolytic solution of hydrochloric acid or nitric acid is an advantageous surface roughening method, and an appropriate anodic time electricity is in the range of from 50 to 400 C/dm$^2$. More specifically, it is preferred to conduct alternating current and/or direct current electrolysis in an electrolytic solution containing from 0.1 to 50% by weight hydrochloric acid or nitric acid under the conditions from 20 to 80° C. in temperature, 1 second to 30 minutes in time and 100 to 400 C/dm$^2$ in electric current density.

The thus surface-roughened aluminum substrate may be chemically etched with an acid or an alkali. The etching agent preferably used includes, for example, sodium hydroxide, sodium carbonate, sodium aluminate, sodium metasilicate, sodium phosphate, potassium hydroxide and lithium hydroxide. A preferred concentration is in the range of 1 to 50% by weight, and a preferred temperature is in the range of 20 to 100° C. Washing with an acid is conducted for removing stain (smut) remaining on the etched surface. Examples of the acid used include nitric acid, sulfuric acid, phosphoric acid, chromic acid, hydrofluoric acid and borohydrofluoric acid. As a specific method for desmutting after the electrochemically space roughening treatment, there are illustrated a method of contacting the aluminum substrate with sulfuric acid from 50 to 90° C. in temperature and from 15 to 65% by weight in concentration described in JP-A-53-12739 and a method of etching the substrate with an alkali described in JP-B-48-28123. The method and conditions are not particularly limited as long as the treated surface has a center-line average roughness, Ra, of 0.2 to 0.5 µm.

The thus surface-roughened aluminum substrate is then subjected to an anodizing treatment to form thereon an oxide film. In the anodizing treatment, sulfuric acid, phosphoric acid, oxalic acid and an aqueous solution of boric acid/sodium borate are used individually or in combination of two or more thereof as a major component of an electrolytic bath. In this occasion, ingredients at least ordinarily contained in an aluminum alloy plate, electrodes, city water, ground water and the like may of course be contained in the electrolytic solution. Further, a second or a third component may be added. Examples of the second and third components include a cation, for example, an ion of metal, e.g., Na, K, Mg, Li, Ca, Ti, Al, V, Cr, Mn, Fe, Co, Ni, Cu or Zn or ammonium ion and an anion, for example, nitrate ion, carbonate ion, chloride ion, phosphate ion, fluoride ion, sulfite ion, titanate ion, silicate ion and borate ion. The ion is allowed to be contained in a concentration of approximately from 0 to 10,000 ppm. Although conditions of the anodizing treatment are not particularly limited, the treatment is preferably conducted by direct current or alternating current electrolysis of from 30 to 500 g/liter in concentration, from 10 to 70° C. in temperature and from 0.1 to 40 A/m$^2$ in electric current density. The thickness of the formed anodic oxide film is in the range of from 0.5 to 1.5 µm, preferably from 0.5 to 1.0 µm.

Further, it is also preferred to undercoat the thus-treated substrate with a water-soluble resin (for example, polyvinylphosphonic acid, a polymer or copolymer having a sulfo group in the side chain thereof or polyacryic acid), a water-soluble metal salt (for example, zinc borate), a yellow dye or an amine salt. Still further, a sol-gel treated substrate to which a functional group capable of causing an addition reaction with a radical is connected via a covalent bond as described in JP-A-7-159983 is preferably used.

Other preferred examples include those obtained by providing a water-resistant hydrophilic layer as a surface layer on an appropriate support. Examples of the surface layer include a layer comprising an inorganic pigment and a binder described in U.S. Pat. No. 3,055,295 and JP-A-56-13168, a hydrophilic swellable layer described in JP-A-9-80744, and a sol-gel film comprising titanium oxide, polyvinyl alcohol and a silicic acid described in JP-T-8-507727 (The term "JP-T" as used herein means a published Japanese translation of a PCT patent application). The hydrophilizing treatment is conducted for the purpose of rendering the surface of the support hydrophilic, and for the purpose of preventing harmful reactions of the photosensitive layer provided thereon and improving adhesion to the photosensitive layer.

[Intermediate Layer]

In the photosensitive lithographic printing plate according to the invention, an intermediate layer may be provided for the purpose of improving adhesion between the photosensitive layer and the substrate and improving stain resistance. Specific examples of the intermediate layer include those described, for example, in JP-B-50-7481, JP-A-54-72104, JP-A-59-101651, JP-A-60-149491, JP-A-60-232998, JP-A-3-56177, JP-A-4-282637, JP-A-5-16558, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, JP-A-11-38635, JP-A-11-38629, JP-A-10-282645, JP-A-10-301262, JP-A-11-24277, JP-A-11-109641, JP-A-10-319600, JP-A-11-327152, JP-A-2000-10292, JP-A-2000-235254, JP-A-2000-352824 and JP-A-2001-209170.

[Coating Solution]

In the coating of the photosensitive layer, each component described above is dissolved in a solvent to prepare a coating solution. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propyolene glycol monoethyl ether acetate, 3-methoxypropyl acetate, N,N-dimethylformamide, dimethylsulfoxide, γ-butyrolactone, methyl lactate and ethyl lactate. The solvents may be used individually or as a mixture thereof.

The concentration of solid content in the coating solution is ordinarily from 1 to 50% by weight.

Further, in order to improve surface quality of coating, a surfactant may be added to the coating solution.

The coating amount of the photosensitive layer is ordinarily from about 0.1 to about 10 g/m$^2$, preferably from 0.3 to 5 g/m$^2$, and more preferably from 0.5 to 3 g/m$^2$, in terms of weight after drying.

[Protective Layer (Oxygen-Shielding Layer)]

It is preferred that in the photosensitive lithographic printing plate of the invention, a protective layer (oxygen-shielding layer) is provided on the photosensitive layer in order to prevent diffusion and penetration of oxygen which hinders polymerization reaction at the time of exposure. The protective layer preferably has oxygen permeability (A) at 25° C. under 1 atmosphere of $1 \leq A \leq 20$ (cc/m$^2$·day). When the oxygen permeability (A) is extremely lower than 1.0 (cc/m$^2$·day), problems may occur in that an undesirable polymerization reaction arises during the production or preservation before exposure and in that undesirable fog or spread of image line generates at the image exposure. On the contrary, when the oxygen permeability (A) greatly exceeds 20 (cc/m$^2$·day), decrease in sensitivity may occur. Besides the above, as for the characteristics required of the protective layer, it is preferred that the protective layer does not substantially hinder the transmission of light for exposure, is excellent in adhesion to the photosensitive layer, and can be easily removed during development process after exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in fundamental characteristics, for example, oxygen-shielding property and removability of the protective layer by development.

Polyvinyl alcohol for use in the protective layer may be partially substituted with ester, ether or acetal as long as it contains unsubstituted vinyl alcohol units for achieving the necessary oxygen-shielding property and water solubility. Also, a part of polyvinyl alcohol may have other copolymer component. As specific examples of polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (manufactured by Kuraray Co., Ltd.). They can be used individually or as a mixture. According to a preferred embodiment, the content of polyvinyl alcohol in the protective layer is from 20 to 95% by weight, more preferably from 30 to 90% by weight.

As a component used as a mixture with polyvinyl alcohol, polyvinyl pyrrolidone or a modified product thereof is preferred from the viewpoint of the oxygen-shielding property and removability by development. The content thereof is ordinarily from 3.5 to 80% by weight, preferably from 10 to 60% by weight, more preferably from 15 to 30% by weight.

The components of the protective layer (the selection of PVA and the use of additives) and the coating amount are selected taking into consideration fogging characteristic, adhesion and scratch resistance besides the oxygen-shielding property and removability by development. In general, the higher the hydrolyzing rate of the PVA used (the higher the unsubstituted vinyl alcohol unit content in the protective layer) and the larger the layer thickness, the higher is the oxygen-shielding property, thus advantageous in the point of sensitivity. When the oxygen-shielding property is extremely high, however, problems may occur in that undesirable polymerization reaction arises during the production or preservation before exposure and in that undesirable fog or spread of image line generates at the image exposure. The oxygen permeability (A) at 25° C. under 1 atmosphere of the protective layer is desirably $1.0 \leqq A \leqq 20$ (cc/m$^2$·day), preferably $1.5 \leqq A \leqq 12$ (cc/m$^2$·day), and more preferably $2.0 \leqq A \leqq 8.0$ (cc/m$^2$·day).

The molecular weight of the (co)polymer, for example, polyvinyl alcohol (PVA) is ordinarily from 2,000 to 10,000,000, and preferably from 20,000 to 3,000,000.

As other components of the protective layer, glycerin, dipropylene glycol or the like can be added in an amount corresponding to several % by weight of the (co)polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the (co)polymer. The thickness of the protective layer is suitably from 0.5 to 5 µm, and particularly preferably from 1 to 3 µm.

The adhesion of the protective layer to the photosensitive layer and scratch resistance are also extremely important in handling of the printing plate. Specifically, when a hydrophilic layer comprising a water-soluble polymer is laminated on a lipophilic photosensitive layer, layer peeling due to insufficient adhesion is liable to occur, and the peeled part causes such a defect as film hardening failure due to polymerization hindrance by oxygen. Various proposals have been made for improving the adhesion between the photosensitive layer and the protective layer. For example, it is described in U.S. patent application Ser. Nos. 292,501 and 44,563 that a sufficient adhesion property cam be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer of the invention. Coating methods of the protective layer are described in detail, for example, in U.S. Pat. No. 3,458,311 and JP-B-55-49729.

A coating amount of the protective layer is ordinarily tom 0.1 to 10 g/m$^2$, and preferably from 0.5 to 5 g/m$^2$, in terms of dry weight.

[Plate-Making Method]

Now, a plate-making method of the photosensitive lithographic printing plate according to the invention will be described in detail. The photosensitive lithographic printing plate is imagewise exposed and then developed with an aqueous alkali solution. The developer for use in the plate-making method according to the invention is described below.

(Developer)

The developer for use in the plate-making method according to the invention is not particularly restricted. However, for example, a solution containing an inorganic alkali salt and a nonionic surfactant and having a pH of from 11.0 to 12.7 is preferably used.

The inorganic alkali salt is appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. The inorganic alkali salts may be used individually or in combination of two or more thereof.

In the case of using the silicate, developing property can be easily adjusted by selecting a mixing ratio of silicon oxide (SiO$_2$) to alkali oxide (M$_2$O (wherein M represents an alkali metal or an ammonium group)), which are the components of the silicate, and the concentration thereof. Of the aqueous alkali solutions, an aqueous alkali solution having the mixing ratio of silicon oxide (SiO$_2$) to alkali oxide (M$_2$O) (SiO$_2$/M$_2$O in molar ratio) of from 0.5 to 3.0 is preferred, and that of from 1.0 to 2.0 is more preferred. The amount of the SiO$_2$/M$_2$O added is preferably from 1 to 10% by weight, more preferably from 3 to 8% by weight, most preferably from 4 to 7% by weight, based on the weight of the aqueous alkali solution. When the concentration is in the above-described range, there arise no reduction in the developing property and processing ability, no formation of precipitates and crystals, and no gelation at neutralization of waste liquor of the developer, thereby causing no troubles in treatment of the waste liquor.

Also, an organic alkali agent may be supplementarily used for the purposes of delicate adjustment of alkali concentration and of assisting dissolution of the photosensitive layer. Examples of the organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The organic alkali agents may be used individually or in combination of two or more thereof.

The surfactant is appropriately used. Examples thereof include nonionic surfactants, for example, a nonionic surfactant having a polyoxyalkylene ether group, a polyoxyethylene alkyl ester (e.g., polyoxyethylene stearate), a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glycerol monooleate); anionic surfactants, for example, an alkylbenzenesulfonate (e.g., sodium dodecylbenzenesulfonate), an alkylnaphthalenesulfonate (e.g., sodium butylnaphthalenesulfonate, sodium pentylnaphthalenesulfonate, sodium hexylnaphthalenesulfonate or sodium octylnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid. Nonionic surfactants having a polyoxyalkylene ether group are particularly preferred.

As the surfactant having a polyoxyalkylene ether group, compounds having the structure represented by formula (X) shown below are preferably used.

$$R_{40}\text{—O—}(R_{41}\text{—O})_p H \quad (X)$$

In the formula, $R_{40}$ represents an alkyl group having from 3 to 15 carbon atoms, an aromatic hydrocarbon group having from 6 to 15 carbon atoms or a heteroaromatic ring group having from 4 to 15 carbon atoms. Each of these groups may have a substituent, and examples of the substituent include an alkylene group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms. $R_{41}$ represents an alkylene group having from 1 to 100 carbon atoms which may have a substituent. Examples of the substituent include an alkyl group having from 1 to 20 carbon atoms and an aromatic hydrocarbon group having from 6 to 15 carbon atoms, p represents an integer of 1 to 100.

In the definition of the formula (X), specific examples of the "aromatic hydrocarbon group" include a phenyl group, a tolyl group, a naphthyl group, an anthryl group, a biphenyl group and a phenanthryl group, and specific examples of the "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R_{41}-O)_p$ in the formula (X) may comprise two or three kinds of groups within the above-described scope. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ether group are used individually or in combination thereof. The surfactant is effectively added in an amount from 1 to 30% by weight, preferably from 2 to 20% by weight, to the developer. When the amount of surfactant added is too small, the developing property may be deteriorated. On the other hand, when the amount is too large, development damage becomes increases and the printing durability of a printing plate may decrease.

Examples of the nonionic surfactant having polyoxyalkylene ether group represented by formula (X) include a polyoxyethylene alkyl ether, e.g., polyoxyethylene lauryl ether, polyoxyethylene cetyl ether or polyoxyethylene stearyl ether, a polyoxyethylene aryl ether, e.g., polyoxyethylene phenyl ether or polyoxyethylene naphthyl ether; and a polyoxyethylene alkylaryl ether, e.g., polyoxyethylene methylphenyl ether, polyoxyethylene octylphenyl ether or polyoxyethylene nonylphenyl ether.

The surfactants can be used individually or in combination thereof. Also, the amount of the surfactant used in the developer is preferably in the range from 0.1 to 20% by weight in terms of the solid content.

The pH of the developer used in the plate-making method according to the invention is ordinarily from 11.0 to 12.7, preferably from 11.5 to 12.5, in view of the image formation and the damage of the exposed area in the development.

The electric conductivity of the developer used in the invention is preferably from 3 to 30 mS/cm. When it is less than the lower limit, dissolution of the photosensitive layer composition on the aluminum plate support surface becomes difficult, resulting in formation of stain at printing in some cases. On the other hand, when it exceeds the upper limit, due to the high concentration of salt, dissolution rate of the photosensitive layer becomes extremely small, resulting in remaining of the layer in the unexposed area in some cases. The electric conductivity is particularly preferably in the range from 5 to 20 mS/cm.

(Exposure and Development Processing)

The photosensitive lithographic printing plate according to the invention is exposed imagewise using a conventionally known active light source, for example, a carbon arc lamp, a high-pressure mercury lamp, a xenon lamp, a metal halide lamp, a fluorescent lamp, a tungsten lamp, a halogen lamp, a helium cadmium laser, an argon ion laser, an FD-YAG laser, a helium neon laser or a semiconductor laser (350 nm to 600 nm) and then subjected to the development processing to form an image on the surface of aluminum plate support.

It is possible to provide, between the imagewise exposure and the development processing, a process of heating the photosensitive layer at a temperature of 50 to 140° C. for 1 second to 5 minutes for the purpose of increasing the curing ratio of the photosensitive layer. The heating at the temperature in the above-described range serves to increase the curing ratio and prevents the remaining layer in the unexposed area due to dark polymerization.

As described hereinbefore, the protective layer is provided on the photosensitive layer of the photosensitive lithographic printing plate according to the invention. There are known a method of removing both the protective layer and the unexposed area of the photosensitive layer at the same time by using a developer and a method of first removing the protective layer with water or warm water, and then removing the unexposed area of the photosensitive layer by development. Into the water or warm water may be incorporated an antiseptic described in JP-A-10-10754 or an organic solvent described in JP-A-8-278636.

The development of the photosensitive lithographic printing plate according to the invention with the above-described developer is conducted in a conventional manner at a temperature from 0 to 60° C., preferably from about 15 to about 40° C., for example, by immersing the exposed photosensitive lithographic printing plate in the developer and rubbing with a brush.

Further, in the case of conducting the development processing using an automatic developing machine, the developing solution becomes fatigued in accordance with the processing amount, and hence the processing ability may be restored by using a replenisher or a fresh developer. The thus development-processed photosensitive lithographic printing plate is after-treated with washing water, a rinse solution containing, for example, a surfactant, or a desensitizing solution containing, for example, gum arabic or a starch derivative as described, for example, in JP-A-54-8002, JP-A-55-115045 and JP-A-59-58431. In the after-treatment of the photosensitive lithographic printing plate according to the invention, these processings may be used in combination.

The printing plate thus-obtained by the above-described processing may be subjected to the after-exposure treatment described in JP-A-2000-89478 or a heating treatment for example, baking, in order to improve printing durability.

The lithographic printing plate thus-obtained is mounted on an offset printing machine to print a large number of sheets.

EXAMPLES

The present invention will be described in more detail with reference to the following examples, but the invention should not be construed as being limited thereto.

Examples 1 to 4 and Comparative Examples 1 and 2

(Preparation Method of Aluminum Support)

A 0.3 mm-thick aluminum plate was etched by dipping in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic surface roughening treatment in a 1% by weight aqueous nitric acid solution using an alternating current with a sinusoidal waveform at an anode time electricity of 300 coulomb/dm². Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to effect a desmut treatment, and then subjected to an anodizing treatment in a 20% by weight aqueous sulfuric acid solution for 2 minutes at a current density of 2 A/dm² to form an anodic oxide film having a thickness of 2.7 g/m². The surface roughness was measured and found to be 0.3 μm (Ra value according to JIS B0601).

(Formation of Intermediate Layer)

On the aluminum plate thus-treated was coated a coating solution for intermediate layer shown below using a bar coater, followed by drying at 80° C. for 20 seconds. A coating amount of the intermediate layer after drying was 10 mg/m².

| Coating Solution for Intermediate Layer | |
|---|---|
| Sol solution shown below | 100 g |
| Methanol | 900 g |
| Sol Solution | |
| Phosmer PE (produced by Uni-Chemical Co., Ltd) | 5 g |
| Methanol | 45 g |
| Water | 10 g |

| -continued | |
|---|---|
| Phosphoric acid (85% by weight) | 5 g |
| Tetraethoxysilane | 20 g |
| 3-Methacryloxypropyltriethoxysilane | 15 g |

(Formation of Photosensitive Layer)

Photo-polymerizable composition P-1 of high sensitivity having the composition shown below was coated on the intermediate layer so as to have a dry coating amount of 1.4 g/m² mid dried at 100° C. for one minute to prepare a photosensitive layer

| Photo-Polymerizable Composition P-1 | |
|---|---|
| Ethylenically unsaturated bond-containing compound (A-1) | 4.2 parts by weight |
| Linear organic polymer (Polymer binder) (B-1) | 3.6 parts by weight |
| Sensitizing agent (C-1) | 0.21 parts by weight |
| Polymerization initiator (D-1) | 0.81 parts by weight |
| Chain transfer agent (compound shown in Table 1 below) | 0.3 parts by weight |
| ε-Phthalocyanine dispersion | 0.76 parts by weight |
| Fluorine-containing nonionic surfactant (Megafac F780, produced by Dainippon Ink & Chemicals, Inc.) | 0.05 parts by weight |
| Methyl ethyl ketone | 58 parts by weight |
| Propylene glycol monomethyl ether acetate | 53 parts by weight |

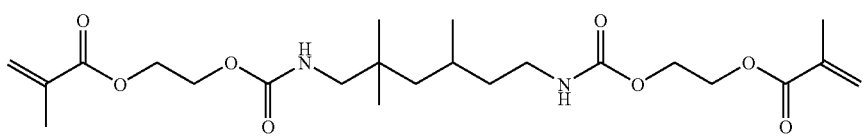

A-1

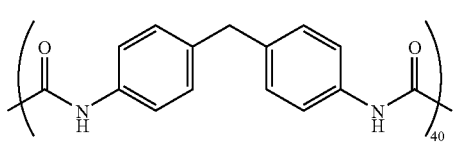
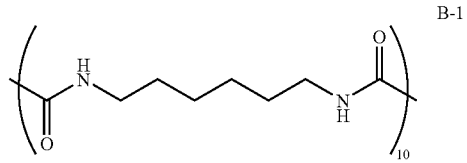

B-1

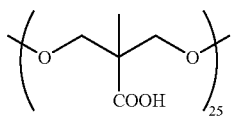
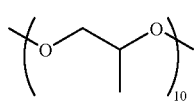

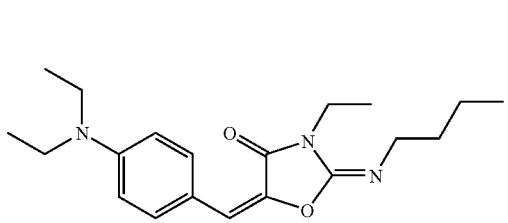

C-1

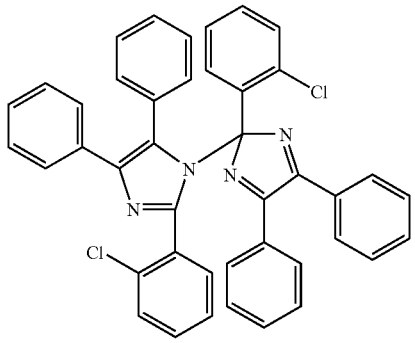

D-1

(Formation of Protective Layer)

A mixed aqueous solution containing polyvinyl alcohol (saponification degree 98% by mole, polymerization degree: 500) and polyvinyl pyrrolidone (Luviscol K-30, produced by BASF) was coated on the surface of the photosensitive layer by a wire bar and dried in a warm air drying apparatus at 125° C. for 75 seconds to form a protective layer. The content of the polyvinyl alcohol/polyvinyl pyrrolidone was 4/1% by weight, and the coating amount (coverage after drying) of the protective layer was 2.45 g/m².

[Evaluation]

(1) Printing Durability

The photosensitive lithographic printing plate obtained was subjected to imagewise drawing using Vx9600CTP (wavelength of light source; 405 nm, produced by Fuji Photo Film Co., Ltd.) while controlling an exposure amount on the surface of photosensitive lithographic printing plate to 0.05 mJ/cm². Then, it was developed using a PS processor (IP850HD, produced by G & J) fed with an alkali developer having the composition shown below at solution temperature of 25° C. for development time of 28 seconds. The lithographic printing plate obtained was subjected to printing by a printing machine (Lithrone, produced by Komori Corp.) using ink (DIC-GEOS (N) black, produced by Dainippon Ink & Chemicals, Inc.) and a number of sheets where it was visually recognized that density of solid image area began to become thin was determined to evaluate the printing durability.

| Composition of Alkali Developer | |
|---|---|
| Potassium hydroxide | 0.15 g |
| Polyoxyethylene naphthyl ether (n = 13) | 5.0 g |
| Chelest 400 (chelating agent) | 0.1 g |
| Water | 94.75 g |

(2) Preservation Stability

The exposure, development and printing were conducted in the same manner as in the evaluation of sensitivity except for using the photosensitive lithographic printing plate after being allowed to standing at 60° C. for 3 days in a state of being tightly closed by aluminum kraft paper together with an interleaf to measure a halftone dot area ratio on a print. Then, difference (Δ%) beeen the halftone dot area ratio measured after being allowed to standing at 60° C. for 3 days and the halftone dot area ratio measured before being allowed to standing at 60° C. for 3 days was determined to use an index of the preservation stability. A smaller absolute numerical value of Δ% shows that the photosensitive printing plate is less affected by the accelerated aging, that is, that the photosensitive printing plate has higher preservation stability. The results obtained are shown in Table 1 below,

TABLE 1

| | Example 1 | Example 2 | Example 3 | Example 4 | Comparative Example 1 | Comparative Example 2 |
|---|---|---|---|---|---|---|
| Chain Transfer Agent | E-1 | E-2 | E-3 | E-4 | E-5 | E-6 |
| Printing Durability (×10⁴ sheets) | 24 | 23 | 21 | 21 | 18 | 17 |
| Accelerated Aging (Δ %) | 1 | 1 | 0 | 0 | 5 | 4 |

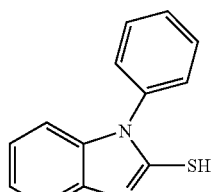

E-1

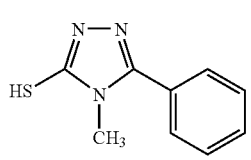

E-2

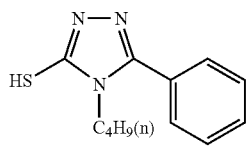

E-3

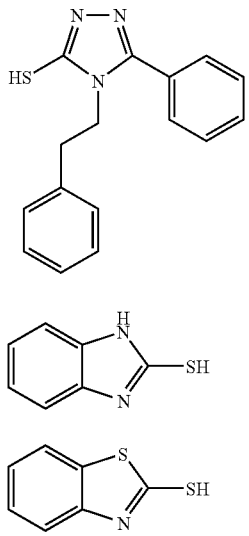

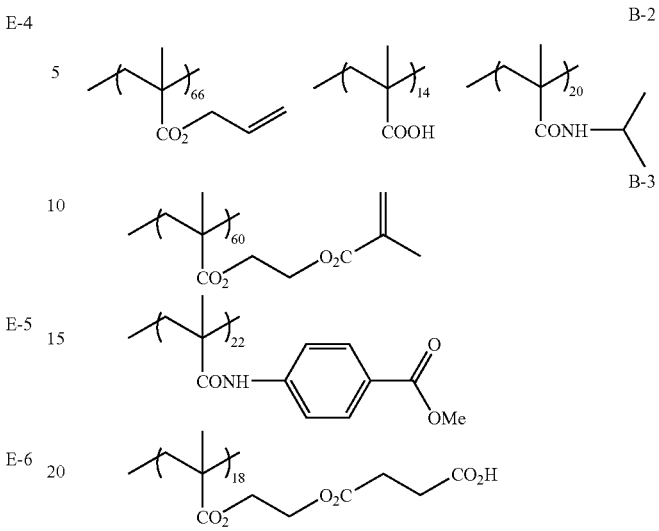

Example 5

A photosensitive lithographic printing plate of Example 5 was obtained in the same manner as in Example 1 except for changing Linear organic polymer (Polymer binder) (B-1) to (B-2) shown below. The photosensitive lithographic printing plate was evaluated in the same manner as in Example 1. The results obtained are shown in Table 2 below.

Example 6

A photosensitive lithographic printing plate of Example 6 was obtained in the same manner as in Example 1 except for changing Linear organic polymer (Polymer binder) (B-1) to (B-3) shown below. The photosensitive lithographic printing plate was evaluated in the same manner as in Example 1. The results obtained are shown in Table 2 below.

Comparative Example 3

A photosensitive lithographic printing plate of Comparative Example 3 was obtained in the same manner as in Comparative Example 1 except for changing Linear organic polymer (Polymer binder) (B-1) to (B-2) shown below. The photosensitive lithographic printing plate was evaluated in the same manner as in Example 1. The results obtained are shown in Table 2 below.

Comparative Example 4

A photosensitive lithographic printing plate of Comparative Example 4 was obtained in the same manner as in Comparative Example 1 except for changing Linear organic polymer (polymer binder) (B-1) to (B-3) shown below. The photosensitive lithographic printing plate was evaluated in the same manner as in Example 1. The results obtained are shown in Table 2 below.

TABLE 2

|  | Example 5 | Example 6 | Comparative Example 3 | Comparative Example 4 |
| --- | --- | --- | --- | --- |
| Chain Transfer Agent | E-1 | E-2 | E-5 | E-6 |
| Printing Durability ($\times 10^4$ sheets) | 13 | 12 | 9 | 9 |
| Accelerated Aging ($\Delta$ %) | 1 | 1 | 4 | 4 |

The photosensitive lithographic printing plate of each of the examples using the thiol compound which is the feature of the invention can be exposed under such a high sensitivity condition as 0.05 mJ/Cm$^2$, and satisfactory results are obtained in both the printing durability and preservation stability. On the contrary, the photosensitive lithographic printing plate of each of the comparative examples is unsatisfactory in the preservation stability and the printing durability under the high sensitivity condition. Also, it is confirmed during the experimentations that in view of the peculiar odor of the thiol compound, the compounds used in the examples are greatly improved in comparison with the compounds used in the comparative examples.

This application is based on Japanese Patent application JP 2004-277399, filed Sep. 24, 2004, the entire content of which is hereby incorporated by reference, the same as if set forth at length.

What is claimed is:

1. A photosensitive lithographic printing plate comprising:
   a hydrophilic support; and
   a photosensitive layer containing a polymerization initiator, a chain transfer agent, a compound having an ethylenically unsaturated double bond and a polymer binder having a crosslinkable group in a side chain,
   wherein the chain transfer agent is a thiol compound represented by the following formula (I):

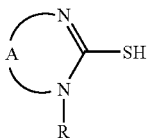

in which R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

2. The photosensitive lithographic printing plate according to claim 1, wherein the thiol compound represented by the formula (I) is at least one selected from the group consisting of compounds represented by the following formulae (II) and (III):

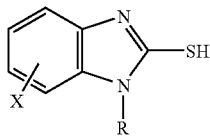

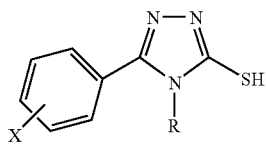

wherein R represents an alkyl group which may have a substituent or an aryl group which may have a substituent; and X represents a halogen atom, an alkoxy group, an alkyl group which may have a substituent or an aryl group which may have a substituent.

3. The photosensitive lithographic printing plate according to claim 1, wherein the polymer binder is at least one selected from the group consisting of a (meth)acrylic copolymer having a crosslinkable group in a side chain and a polyurethane resin having a crosslinkable group in a side chain.

4. The photosensitive lithographic printing plate according to claim 1, wherein the polymerization initiator is at least one selected from the group consisting of a hexaarylbiimidazole compound, an onium salt, a trihalomethyl compound and a metallocene compound.

5. The photosensitive lithographic printing plate according to claim 1, which further comprises a protective layer so that the hydrophilic support, the photosensitive layer and the protective layer are in this order.

6. The photosensitive lithographic printing plate according to claim 5, wherein the protective layer comprises a polyvinyl alcohol.

7. The photosensitive lithographic printing plate according to claim 6, wherein a content of the polyvinyl alcohol in the protective layer is tom 20 to 95% by weight.

8. The photosensitive lithographic printing plate according to claim 6, wherein the protective layer farther comprises a polyvinyl pyrrolidone or a modified product thereof.

9. The photosensitive lithographic printing plate according to claim 1, wherein the photosensitive layer further contains a sensitizing dye.

10. The photosensitive lithographic printing plate according to claim 1, wherein a coating amount of the photosensitive layer is from 0.1 to 10 g/m$^2$.

* * * * *